United States Patent
Lan et al.

(10) Patent No.: US 12,021,499 B2
(45) Date of Patent: **\*Jun. 25, 2024**

(54) ELECTRODE DEFINED RESONATOR

(71) Applicant: II-VI Delaware, Inc, Wilmington, DE (US)

(72) Inventors: Di Lan, Tampa, FL (US); Wen-Qing Xu, Sarver, PA (US); Giovanni Barbarossa, Saratoga, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/298,221

(22) Filed: Apr. 10, 2023

(65) Prior Publication Data

US 2023/0268903 A1    Aug. 24, 2023

Related U.S. Application Data

(63) Continuation of application No. 17/444,736, filed on Aug. 9, 2021, now Pat. No. 11,652,465, which is a continuation of application No. 16/037,499, filed on Jul. 17, 2018, now Pat. No. 11,121,696.

(60) Provisional application No. 62/699,078, filed on Jul. 17, 2018.

(51) Int. Cl.
| | | |
|---|---|---|
| H03H 9/05 | (2006.01) |
| H03H 9/02 | (2006.01) |
| H03H 9/13 | (2006.01) |
| H03H 9/17 | (2006.01) |

(52) U.S. Cl.
CPC ...... *H03H 9/0547* (2013.01); *H03H 9/02102* (2013.01); *H03H 9/02228* (2013.01); *H03H 9/13* (2013.01); *H03H 9/176* (2013.01)

(58) Field of Classification Search
CPC .. H03H 9/0547; H03H 9/02102; H03H 9/176; H03H 9/02228; H03H 9/172
See application file for complete search history.

(56) References Cited

U.S. PATENT DOCUMENTS

| | | | |
|---|---|---|---|
| 7,842,134 B2 | 11/2010 | Whitehead et al. |
| 7,843,284 B2 | 11/2010 | Ayazi et al. |
| 9,337,799 B2 | 5/2016 | Stephanou et al. |
| 10,164,601 B2 | 12/2018 | Marksteiner |

(Continued)

FOREIGN PATENT DOCUMENTS

| | | |
|---|---|---|
| EP | 2658122 A1 | 10/2013 |
| JP | 2003530705 A | 10/2003 |

(Continued)

OTHER PUBLICATIONS

"Office Action in counterpart Japan Appl. 2019-131179, dated Jun. 16, 2020, 8 pages".

(Continued)

*Primary Examiner* — Jeffrey M Shin
(74) *Attorney, Agent, or Firm* — Blank Rome LLP

(57) ABSTRACT

A bulk acoustic resonator operable in a bulk acoustic mode includes a resonator body mounted to a separate carrier that is not part of the resonator body. The resonator body includes a piezoelectric layer, a device layer, and a top conductive layer on the piezoelectric layer opposite the device layer. A surface of the device layer opposite the piezoelectric layer is for mounting the resonator body to the carrier.

25 Claims, 15 Drawing Sheets

(56) References Cited

U.S. PATENT DOCUMENTS

| | | |
|---|---|---|
| 10,320,361 B2 | 6/2019 | Meltaus et al. |
| 11,121,696 B2 * | 9/2021 | Lan .................. H03H 9/176 |
| 11,218,132 B2 | 1/2022 | Xu et al. |
| 11,362,640 B2 | 6/2022 | Xu et al. |
| 11,652,465 B2 * | 5/2023 | Lan .................. H03H 9/176 |
| | | 310/346 |
| 11,738,539 B2 | 8/2023 | Xu et al. |
| 2006/0113545 A1 | 6/2006 | Weber et al. |
| 2007/0296521 A1 | 12/2007 | Schmidhammer |
| 2008/0079515 A1 | 4/2008 | Ayazi et al. |
| 2009/0096550 A1 | 4/2009 | Handtmann et al. |
| 2009/0142480 A1 | 6/2009 | Godshalk et al. |
| 2009/0142485 A1 | 6/2009 | Lai et al. |
| 2013/0099630 A1 | 4/2013 | Matsuda et al. |
| 2014/0117815 A1 | 5/2014 | Bi et al. |
| 2014/0118087 A1 | 5/2014 | Burak et al. |
| 2014/0125432 A1 | 5/2014 | Stephanou et al. |
| 2014/0152146 A1 | 6/2014 | Kimura et al. |
| 2015/0263697 A1 | 9/2015 | Zhang et al. |
| 2015/0357375 A1 | 12/2015 | Tsai et al. |
| 2016/0182007 A1 | 6/2016 | Bhattacharjee |
| 2016/0186362 A1 | 6/2016 | Mollart et al. |
| 2016/0365842 A1 | 12/2016 | Marksteiner |
| 2017/0033769 A1 | 2/2017 | Yokoyama |
| 2017/0034358 A1 | 2/2017 | Bianco et al. |
| 2017/0117872 A1 | 4/2017 | Morton et al. |
| 2020/0287514 A1 | 9/2020 | Xu et al. |

FOREIGN PATENT DOCUMENTS

| | | |
|---|---|---|
| JP | 2006246451 A | 9/2006 |
| JP | 2008504756 A | 2/2008 |
| JP | 2008301453 A | 12/2008 |
| JP | 2013528996 A | 7/2013 |
| JP | 2014171218 A | 9/2014 |
| JP | 2016127585 A | 7/2016 |
| JP | 2017034358 A | 2/2017 |
| JP | 2017509246 A | 3/2017 |
| WO | 0178230 A1 | 10/2001 |
| WO | 2017070177 A1 | 4/2017 |

OTHER PUBLICATIONS

"Office Action in counterpart Taiwan Appl. 108124948, dated Jul. 27, 2020, 10 pages".

"First Office Action in counterpart Korean Appl. 10-2020-0070691, dated Nov. 26, 2021, 13-pages".

"Office Action in counterpart Japan APPi. 2019-131179, dated Jun. 16, 2020, 8 pages".

* cited by examiner

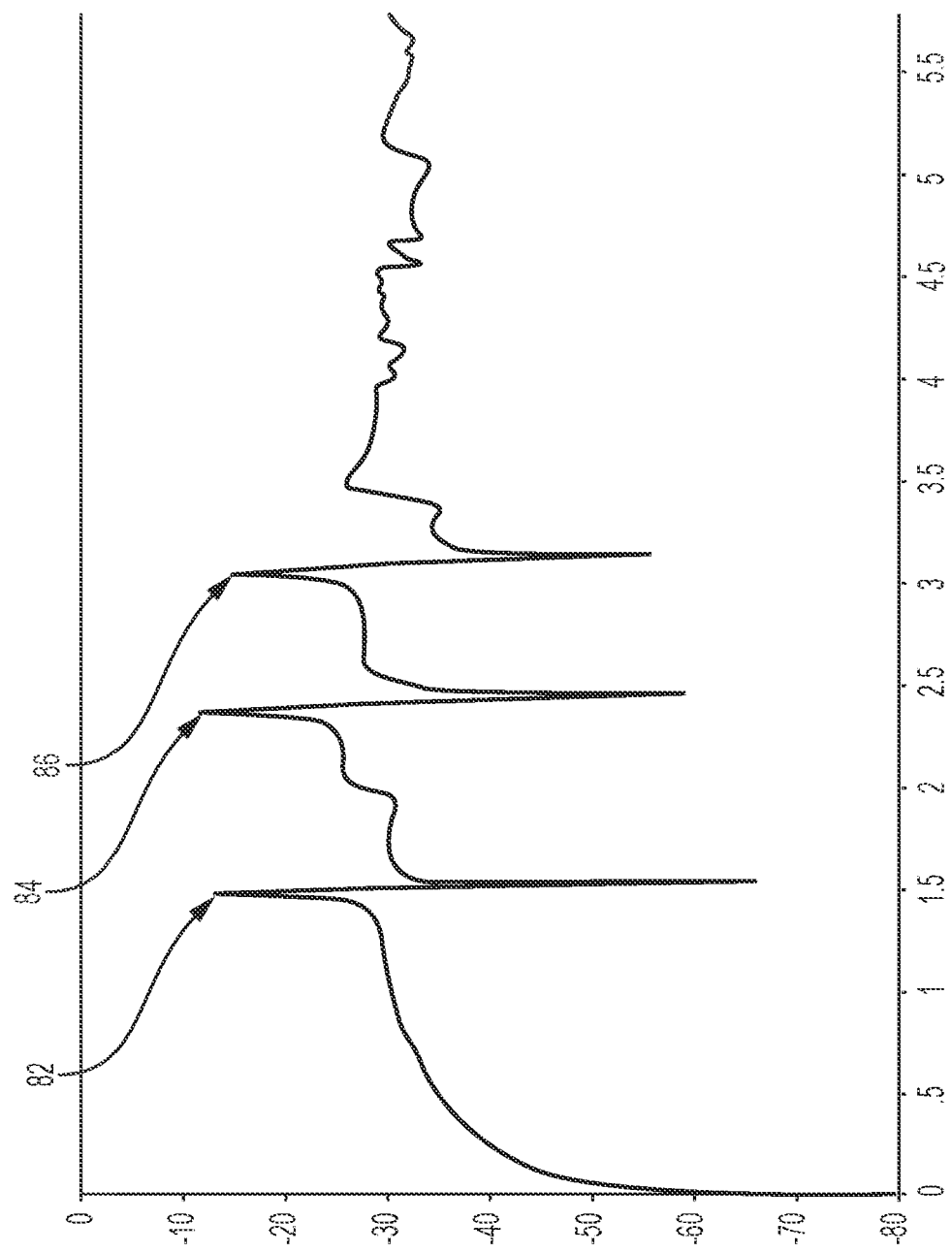

ELECTRODE DEFINED RESONATOR

CROSS-REFERENCE TO RELATED APPLICATION

This application is a continuation of U.S. patent application Ser. No. 17/444,736, filed Aug. 9, 2021 which is a continuation of U.S. patent application Ser. No. 16/037,499 filed Jul. 17, 2018, which claims the benefit of U.S. Provisional Patent Application No. 62/699,078, filed Jul. 17, 2018, entitled "Electrode Defined Resonator", the contents for both of which are incorporated herein by reference.

BACKGROUND OF THE INVENTION

Field of the Invention

The present invention relates to a bulk acoustic resonator and, more particularly, to a bulk acoustic resonator having a resonator body and, optionally, one or more connecting structures that can be used for supplying electrical signals to one or more conductive layers of the resonator body.

Description of Related Art

Radio frequency communications have progressed from "1G" system in 1980's, to "2G" system in 1990's, "3G" in early 2000's, to current "4G" system that was standardized in 2012. In current RIP communications, the RF signal is filtered with surface-acoustic-wave (SAW) filters or bulk-acoustic-wave (BAW) filters.

Film-bulk-acoustic-resonators (FBAR) and Solid-Mounted-Resonators (SMR) are two types of BAW filters that are piezoelectric-driven micro-electro-mechanical-system (MEMS) devices that enable current 4G RF communications capable of resonating at a relatively high frequency with a relatively low insertion loss, as compared to SAW filter devices. These RAW acoustic resonators comprise a piezoelectric stack that includes, in one example, a thin film of piezoelectric material sandwiched between a thin film top electrode and a thin film bottom electrode. The resonance frequency of such piezoelectric stack is thickness-based or depends on the thickness of the thin films of the piezoelectric stack. The resonance frequency increases as the thickness of thin films of the piezoelectric stack decreases. The film thickness of the resonant bodies is critical and has to be precisely controlled for a desirable resonance frequency. It is difficult and time consuming to trim different areas of a piezoelectric stack to achieve a high level of thickness uniformity for the attainment of a reasonable yield of FBAR and SMR fabrication process for a targeted or specified RF frequency.

5G RF communication systems that are being developed will eventually replace the aforementioned lower performance earlier generation communication systems that Operate at RF frequencies between several hundreds of MHz and 1.8 GHz. 5G systems will instead operate at RF frequencies that are much higher, 3-6 GHz (sub-6 GHz) and possibly all the way up to 100 GHz, or so.

Because of this increase in frequency, the film thickness for FBAR and SMR-based RF filters for 5G applications would have to be reduced in order to increase the resonance frequency, which is one of the challenges current state-of-the-art BAW acoustic resonators face. The reduction in the piezoelectric film thickness means that the distance between top and bottom electrodes of the piezoelectric stack is also reduced, which leads to an increase in electric capacitance. This increase in electrical capacitance leads to a higher feedthrough of RF reducing the signal to noise ratio, which is undesirable. The optimal piezoelectric coupling efficiency of a piezoelectric stack (including top electrode, a bottom electrode, and a piezoelectric layer sandwiched between the top and bottom electrodes) can result from a proper combination of the thickness of the piezoelectric layer, the thickness of the top electrode, the thickness of the bottom electrode, and the alignment and orientation of the piezoelectric crystal(s). The reduction in the piezoelectric film thickness for the purpose of achieving the desirably high RF frequency operation for 5G communication may not allow the attainment of an optimal piezoelectric coupling efficiency, which results in a higher insertion loss and a higher motion impedance. The thickness of the electrodes, either the top electrode, the bottom electrode, or both, may also need to be reduced. Reduction in electrode thickness leads to an increase in electrical resistivity, which leads to another undesirable limitation, namely, higher insertion loss.

Furthermore, the product of frequency and Quality-Factor (or Q) of FBAR and SMR devices are typically constant, which means that an increase in resonance frequency will lead to a decrease in Q. A decrease in Q is undesirable, particularly given that the state of art, of FBAR and SMR's Q is approaching the theoretical limit at a frequency 2.45 GHz or below. Therefore, doubling the frequency will lead to a reduction of Q value, which is not desirable for making a RF devices such as an RF filter, an RF resonator, an RF switch, an RF oscillator, etc.

SUMMARY OF THE INVENTION

Generally, provided is a resonator body that can operate in a bulk acoustic mode, preferentially in a lateral resonance mode. The bottom of the resonator body can be mounted or coupled to a mounting substrate or carrier while still allowing the use of the resonator body as an RF filter, an RF resonator, an RF switch, an RF oscillator, etc.

Also provided is a bulk acoustic resonator that includes the resonator body and one or more connecting structures that enable electrical signals to be provided to one or more conductive layers of the resonator body. In one preferred and non-limiting embodiment or example, the one or more connecting structures can be integral with and/or formed from the same layers of materials as the resonator body whereupon the bulk acoustic resonator can be a unitary piece. The bottom of the unitary piece bulk acoustic resonator can be mounted or coupled to a mounting substrate or carrier while still allowing the use of the resonator body as an RF filter, an RF resonator, an RF switch, an RF oscillator, etc.

BRIEF DESCRIPTION OF THE DRAWING(S)

These and other features of the present invention will become more apparent from the following description in which reference is made to the appended drawings wherein.

Figure 9A:
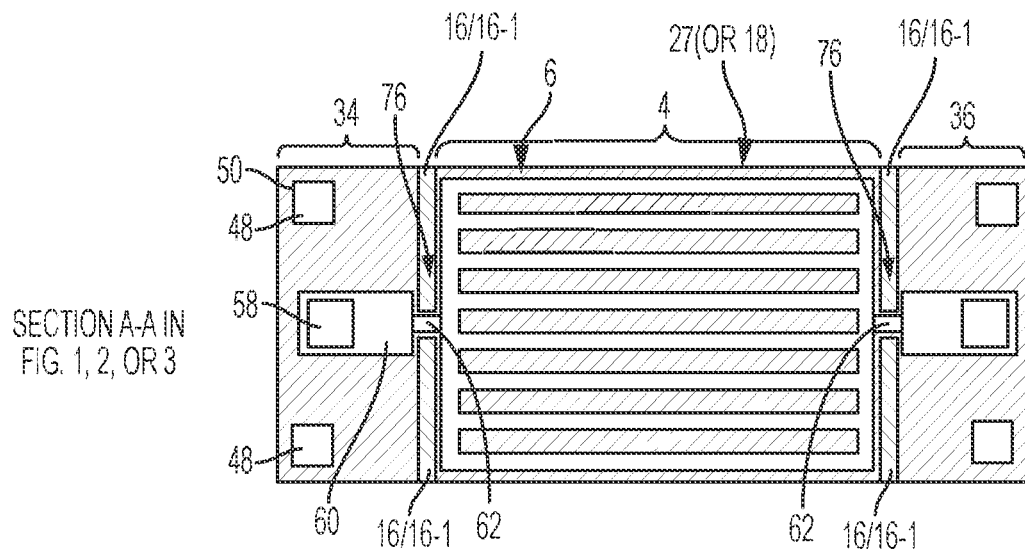
FIGS. 9A-9B are sections of preferred and non-limiting embodiments or examples taken along lines A-A and B-B in each of FIGS. 1-3.
Figure 9B:
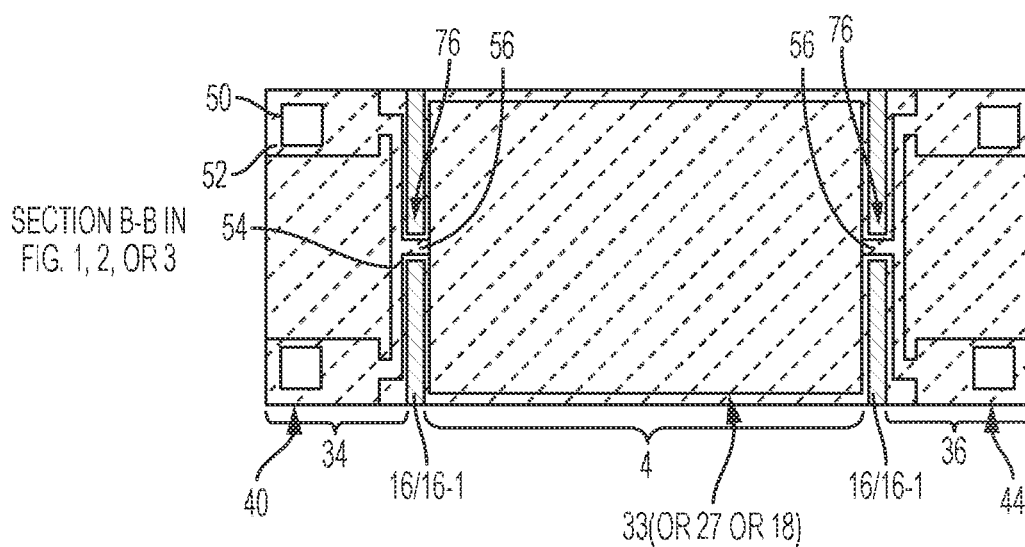

FIG. 9F is a side view of one preferred and non-limiting embodiment or example unsuspended bulk acoustic resonator according to the principles of the present invention with materials of the first and second connecting structures and on both sides of the tether conductors removed as shown in FIGS. 9A-9B; and FIG. 10 is a plot of frequency vs. dB for a resonator body having a bottom conductive layer in the form of a sheet electrode and a top conductive layer in the form of an comb electrode with a finger pitch of 1.8 μm.

DESCRIPTION OF THE INVENTION

For the purposes of the following detailed description, it is to be understood that the invention may assume various alternative variations and step sequences, except where expressly specified to the contrary. It is also to be understood that the specific devices and methods described in the following specification are simply exemplary embodiments, examples, or aspects of the invention. Moreover, other than in any operating examples, or where otherwise indicated, all numbers expressing, in preferred and non-limiting embodiments, examples, or aspects, quantities of ingredients used in the specification and claims are to be understood as being modified in all instances by the term "about". Accordingly, unless indicated to the contrary, the numerical parameters set forth in the following specification and attached claims are approximations that may vary depending upon the desired properties to be obtained by the present invention. Accordingly, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

It is also to be understood that the specific devices and processes illustrated in the attached drawings, and described in the following specification, are simply exemplary embodiments, examples, or aspects of the invention, Hence, specific dimensions and other physical characteristics related to the embodiments, examples, or aspects disclosed herein are not to be considered as limiting. Certain preferred and non-limiting embodiments, examples, or aspects of the present invention will be described with reference to the accompanying figures where like reference numbers correspond to like or functionally equivalent, elements.

In this application, the use of the singular can include the plural and plural encompasses singular, unless specifically stated otherwise. In addition, in this application, the use of "or" means "and/or" unless specifically stated otherwise, even though "and/or" may be explicitly used in certain instances. Further, in this application, the use of "a" or "an" means "at least one" unless specifically stated otherwise.

For purposes of the description hereinafter, the terms "end," "upper," "lower," "right," "left," "vertical," "horizontal," "top," "bottom," "lateral," "longitudinal," and derivatives thereof shall relate to the example(s) as oriented in the drawing figures. However, it is to be understood that the example(s) may assume various alternative variations and step sequences, except where expressly specified to the contrary. It is also to be understood that the specific example(s) illustrated in the attached drawings, and described in the following specification, are simply exemplary examples or aspects of the invention. Hence, the specific examples or aspects disclosed herein are not to be construed as limiting.

Figure 1:
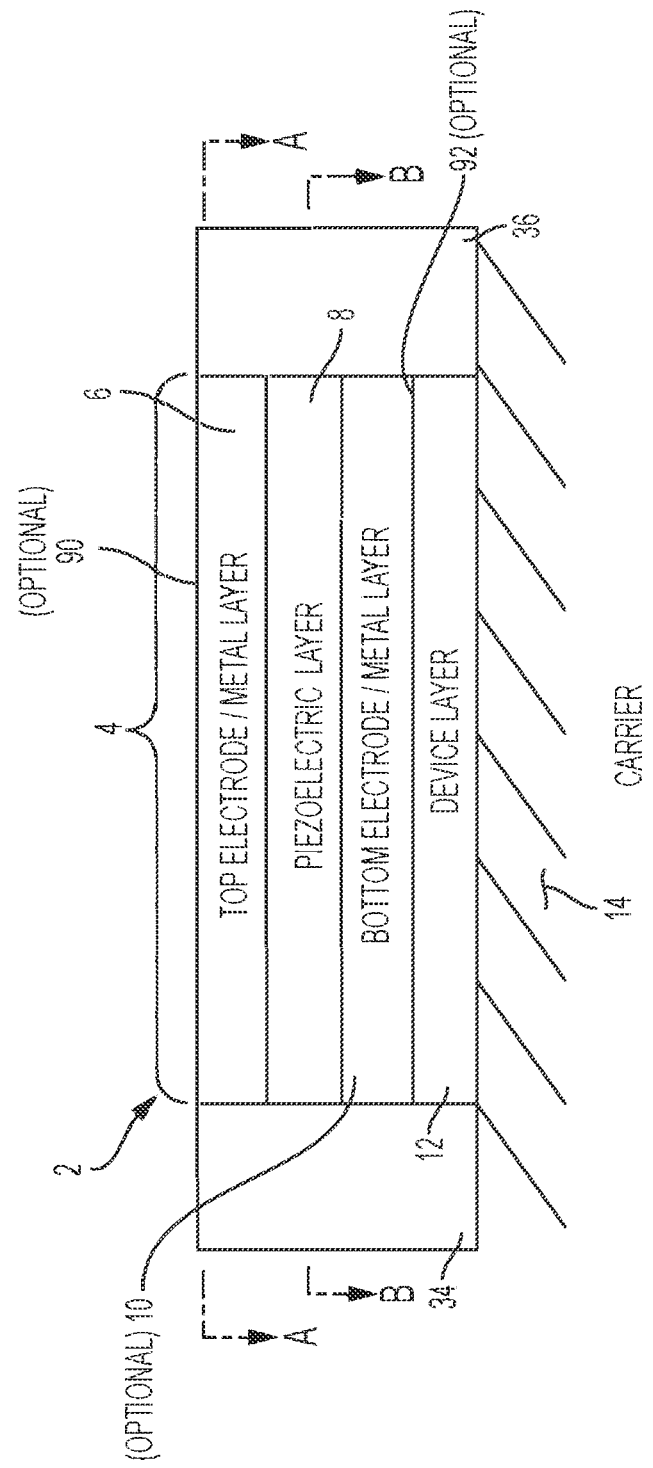
FIG. 1 is a side view of one preferred and non-limiting embodiment or example unsuspended bulk acoustic resonator according to the principles of the present invention.

With reference to FIG. 1, in one preferred and non-limiting embodiment or example, an unsuspended bulk acoustic resonator (UBAR) 2 in accordance with the principles of the present invention, that, can be operable in a bulk acoustic mode, can include a resonator body 4 that can include from a top thereof to a bottom thereof a stack of layers comprising a top conductive layer 6, a piezoelectric layers 8, an optional bottom conductive layer 10, and a device layer 12. In the example UBAR 2 shown in FIG. 1, the bottom of device layer 12 can be mounted, e.g., mounted directly, to a mounting substrate or carrier 14.

Figure 2:
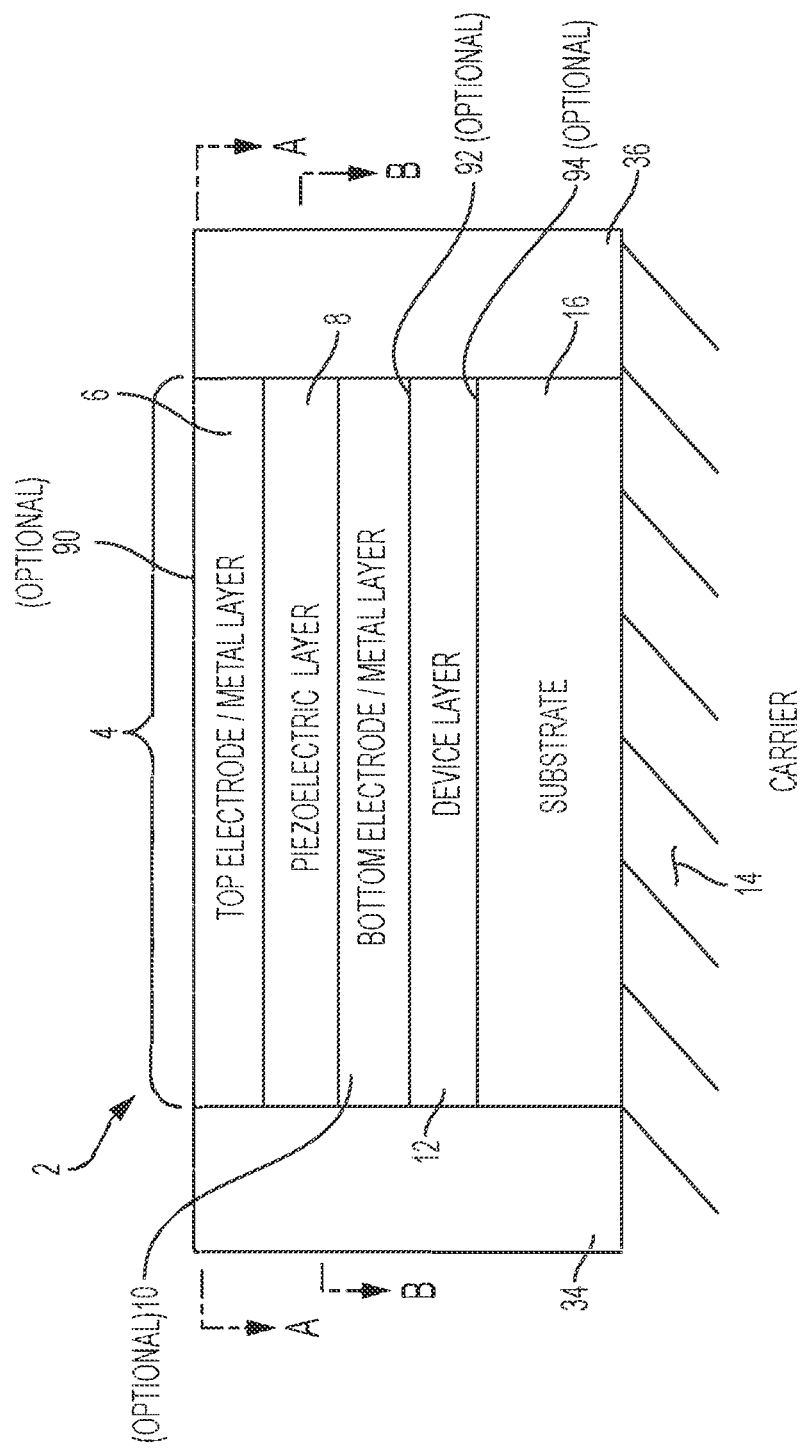
FIG. 2 is a side view of one preferred and non-limiting embodiment or example unsuspended bulk acoustic resonator according to the principles of the present invention.

With reference to FIG. 2 and with continuing reference to FIG. 1, in one preferred and non-limiting embodiment or example, another example UBAR 2 in accordance with the principles of the present invention can be similar to UBAR 2 shown in FIG. 1 with at least the exception that resonator body 4 in FIG. 2 can include an optional substrate 16 between device layer 12 and carrier 14. In an example, the bottom of device layer 12 can be mounted, e.g., mounted directly, to the top of substrate 16 and the bottom of substrate 16 can be mounted, e.g., mounted directly, to carrier 14.

Figure 3:
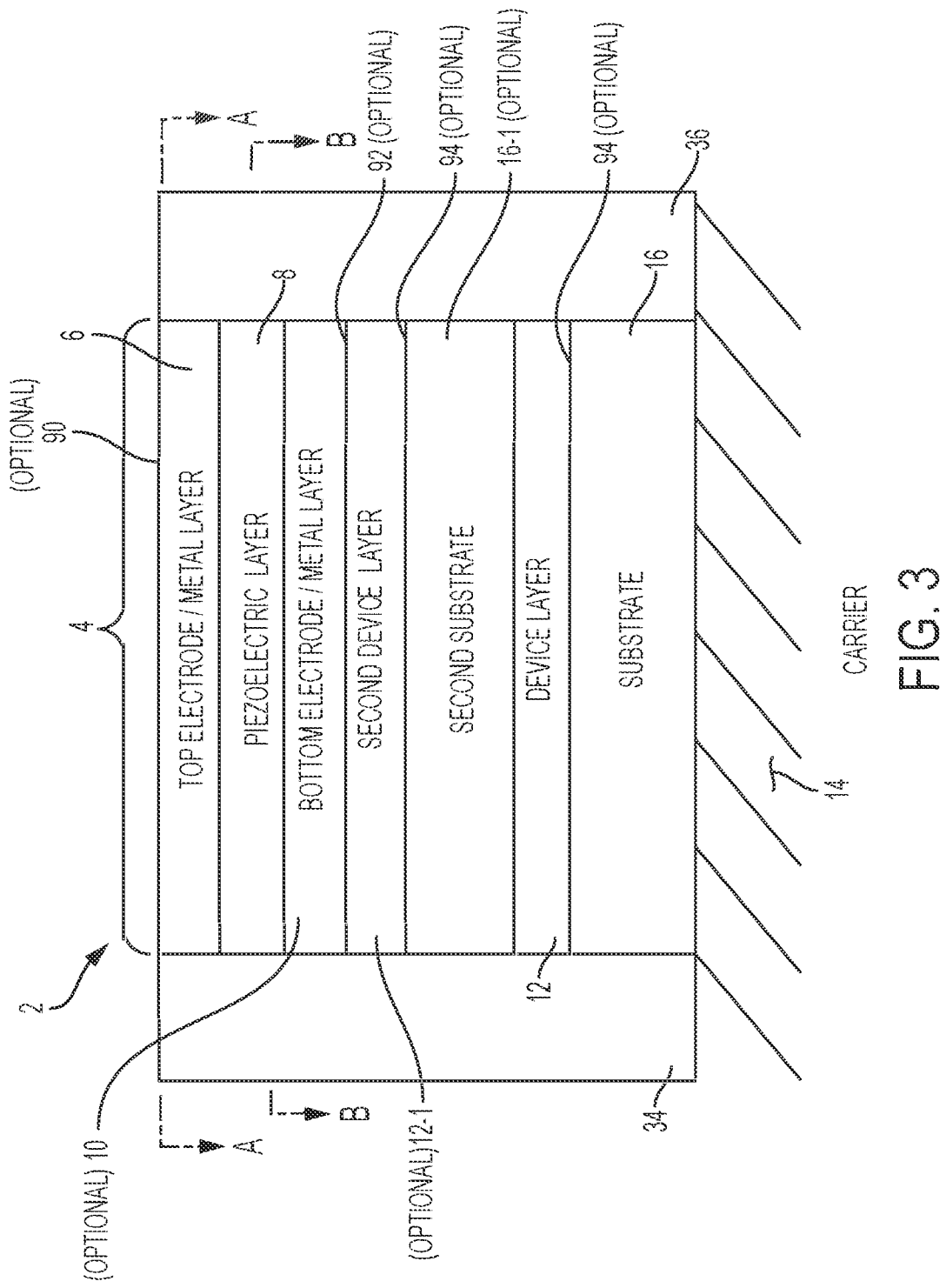
FIG. 3 is a side view of one preferred and non-limiting embodiment or example unsuspended bulk acoustic resonator according to the principles of the present invention.

With reference to FIG. 3 and continuing reference to FIGS. 1 and 2, in one preferred and non-limiting embodiment or example, another example UBAR 2 in accordance with the principles of the present invention can be similar to UBAR 2 shown in FIG. 2 with at least the exception that resonator body 4 in FIG. 3 can include an optional second substrate 16-1 between device layer 12 and piezoelectric layer 8 or optional bottom conductive layer 10, if provided, and/or an optional second device layer 12-1 between second substrate 16-1 and piezoelectric layer 8 or optional bottom conductive layer 10, if provided. In one preferred and non-limiting embodiment or example, it is envisioned that resonator body 4 in FIG. 3 can further include one or more additional device layers 12 (not specifically shown) and/or one or more additional substrates 16 (not specifically shown) as deemed suitable and/or desirable. An example resonator body 4 having a number of device layers 12 and substrates 16 can include, in an exemplary order from piezoelectric layer 8 or optional bottom conductive layer 10, if provided, to carrier 14, the following: a first device layer, a first substrate; a second device layer, a second substrate; a third device layer, a third substrate; . . . and so forth. In one preferred and non-limiting embodiment or example, where resonator body 4 can include a plurality of device layers 12 and/or a plurality of substrates 16, each device layer 12 can be made of the same or a different material and each substrate 16 can be made of the same or a different material. In one preferred and non-limiting embodiment or example, the number of device:layers 12 and the number of substrates 16 can be different. In an example, in an exemplary order from piezoelectric layer 8 or optional bottom conductive layer 10, if provided, to carrier 14, resonator body 4 can include the following: device layer 12-1, substrate 16-1, and device layer 12 as the bottommost layer of resonator body 4. Examples of materials that can be used to form each device layer 12 and each substrate 16 will be described hereinafter.

In one preferred and non-limiting embodiment or example, as shown in FIGS. 1-3, one or more optional temperature compensation layer 90, 92, and 94 can be provided on the top surface of top conductive layer 6; between piezoelectric layer 8 or optional bottom conductive layer 10, if provided, and device layer 12; and/or between device layer 12 (or 12-1) and substrate 16 (or 16-1), if provided. Each temperature compensation layer can comprise at least one of silicon and oxygen. In an example, each temperature compensation layer can comprise silicon dioxide, or a silicon element, and/or an oxygen element. When provided, the one or more optional temperature compensation layer 90, 92, and 94 can help avoid a change in the resonant frequency of each example resonator body 4 shown in FIGS. 1-3 due to heat generated during use.

In plan view, each resonator body 4 and/or UBAR 2 described herein can have a square or rectangular shape. However, resonator body 4 and/or UBAR 2 having other shapes is envisioned.

Figure 4A:
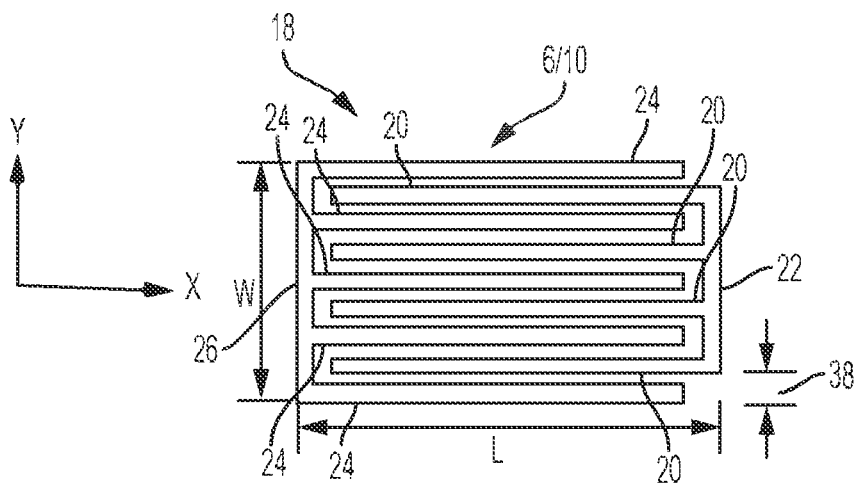
FIG. 4A is an isolated plan view of one preferred and non-limiting embodiment or example form of an interdigitated electrode that can be used as a top conductive layer, an optional bottom conductive layer, or both of an unsuspended bulk acoustic resonator according to the principles of the present invention.
Figure 4B:
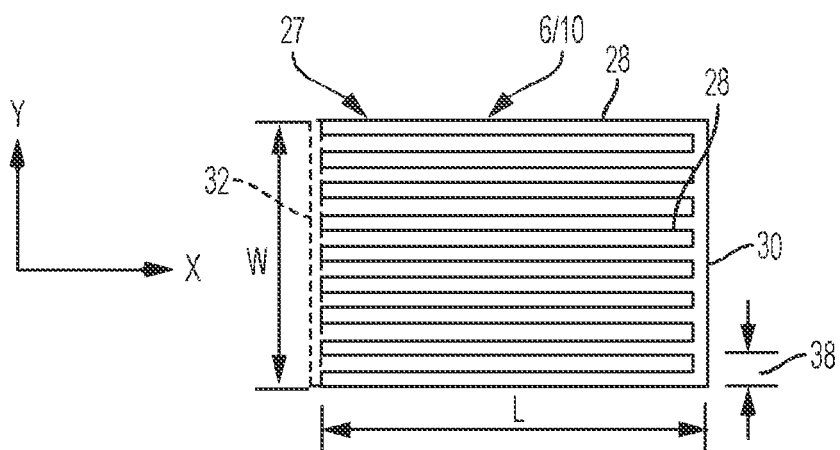
FIG. 4B is an isolated plan view of one preferred and non-limiting embodiment or example form of a comb electrode that can be used as a top conductive layer, an optional bottom conductive layer, or both of an unsuspended bulk acoustic resonator according to the principles of the present invention.
Figure 4C:
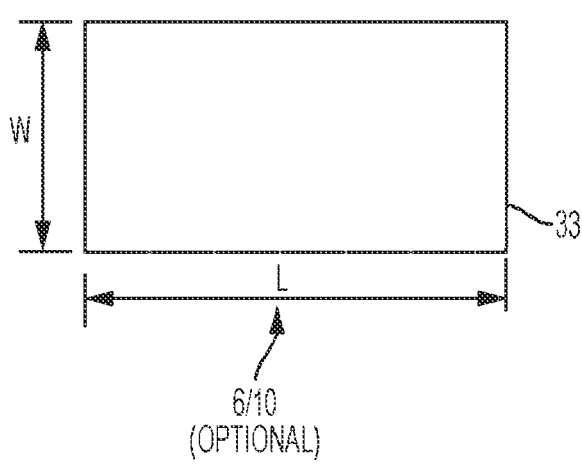
FIG. 4C is an isolated plan view of one preferred and non-limiting embodiment or example form of a sheet electrode that can be used as a top conductive layer, an optional bottom conductive layer, or both of an unsuspended bulk acoustic resonator according to the principles of the present invention.

With reference to FIGS. 4A-4C and with continuing reference to all previous figures, in one preferred and non-limiting embodiment or example, one or both of conductive layer 6 and optional conductive layer 10 can be in the form of an interdigitated electrode 18 (FIG. 4A) that can include conductive lines or fingers 20, supported by a back 22, interdigitated with conductive lines or fingers 24, supported by a back 26, In one preferred and non-limiting embodiment or example, one or both of conductive layer 6 and optional conductive layer 10 can be in a form of a comb electrode 27 (FIG. 4B) that can include conductive lines or fingers 28 extending from a first back 30. The ends of conductive lines or fingers 28 opposite first back 30 can be connected to an optional second back 32 (shown in phantom in FIG. 4B). In one preferred and non-limiting embodiment or example, one or both of conductive layer 6 and optional conductive layer 10 can be in a form of a conductive sheet electrode 33 (FIG. 4C). Each line or finger 20, 24 and 28 is shown as a straight line. In an example, each line or finger 20, 24 and 28 may be an arched line or finger, a spiral line or finger, or any other suitable and/or desirable shape.

In one preferred and non-limiting embodiment or example, top conductive layer 6 can be in the form of an interdigitated electrode 18, or a comb electrode 27, or a sheet electrode 33, Independent of the form of top conductive layer 6, optional bottom conductive layer 10, if provided, can be in the form of an interdigitated electrode 18, or a comb electrode 27, or a sheet electrode 33. Hereinafter, and for the purpose of description only, in one preferred and non-limiting embodiment or example, top conductive layer 6 will be described as being in the form of a comb electrode 27, that includes the first back 30 and the optional second back 32, and optional bottom conductive layer 10 will be described as being in the form of sheet electrode 33. However, this is not to be construed in a limiting sense since the use is envisioned of any one of interdigitated electrode 18, or comb electrode 27, or sheet electrode 33 for top conductive layer 6, in combination with any one of interdigitated electrode 18, or comb electrode 27, or sheet electrode 33 for optional bottom conductive layer 10.

In one preferred and non-limiting embodiment or example, the resonant frequency of each example resonator body 4 having at least top conductive layer 6 in the form of interdigitated electrode 18 or comb electrode 27, regardless of the form of optional bottom conductive layer 10, if provided, can be tuned or selected in a manner known in the art by appropriate selection of a finger pitch 38 (see e.g., FIGS. 4A-4B), wherein finger pitch 38=finger width+finger gap (between adjacent fingers). In an example, where it is desired that each example resonator body 4 resonate primarily, but not entirely, in lateral mode, versus a thickness mode, the resonant frequency of resonator body 4 can be increased by decreasing the finger pitch 38. In an example, where it is desired that each example resonator body 4 resonate primarily, but not entirely, in the thickness mode, versus lateral mode, the resonant frequency of resonator body 4 can be decreased by increasing the finger pitch 38.

In one preferred and non-limiting embodiment or example, each example resonator body 4 can resonate in a thickness mode, a lateral mode, or a hybrid or a composite mode which is the combination of thickness mode and lateral mode. For thickness mode resonance, the acoustic wave resonates in the direction of piezoelectric layer 8 thickness and the resonant frequency is based on the thickness of the piezoelectric layer 8, and the thickness of the top conductive layer 6 and the optional bottom conductive layer 10, if provided. The combination of piezoelectric layer 8, optional bottom conductive layer 10, if provided, and top conductive layer 6 may be referred to as a piezoelectric stack. The acoustic velocity that determines the resonant frequency of each example resonator body 4 described herein is a composite acoustic velocity of the piezoelectric stack. In an example, the resonant frequency, f, can be calculated by dividing the composite acoustic velocity, $V_a$, by twice the piezoelectric stack thickness, τ.

For lateral mode resonance, the acoustic wave resonates in a lateral direction (x or y direction) of piezoelectric layer 8 and the resonant frequency can be determined by dividing the composite acoustic velocity of the piezoelectric stack, $V_a$, by twice the finger pitch 38, $f=V_a/2(\text{finger pitch})$. When the finger pitch is reduced from a large pitch size, $\delta_L$, to a small pitch size, $\delta_S$, the percentage of the frequency increase $PFI_{Calculated}$, can, in an example, be determined by $$PFI_{Calculated} = (\delta_L - \delta_S)/\delta_S.$$

In an example, when the finger pitch 38 is reduced from 2.2 μm to 1.8 μm, the $PFI_{Calculated}$ for lateral mode is 22.2%. In another example, when the finger pitch 38 is reduced from 1.8 μm to 1.4 μm, the $PFI_{Calculated}$ for a lateral mode is 28.5%.

A composite mode resonance can include a portion of thickness mode resonance and a portion of lateral mode resonance. The portion of the lateral mode resonance, L, in a composite mode resonance can be defined by a ratio of the real or measured percentage of the frequency increase, $PFI_{Measured}$, to a calculated percentage of the frequency increase, $PFI_{Calculated}$, by changing the finger pitch 38 from a large pitch size, $\delta_L$, to a small pitch size, $\delta_S$. The lateral mode resonance, L, value can be greater than 100% if there are one or more uncontrolled or unforeseeable variations. In an example, resonator body 4 can resonate in a thickness mode, in a lateral mode, or in a composite mode. In an example of composite mode resonance, the portion of the lateral mode resonance, L, can be ≥20%. In another example of composite mode resonance, the portion of the lateral mode resonance, L, can be ≥30%, In another example of composite mode resonance, the portion of the lateral mode resonance, L, can be ≥40%.

In one preferred and non-limiting embodiment or example, a resonator body 4 having optional bottom conductive layer 10 in the form of sheet electrode 33 and a top conductive layer 6 in the form of comb electrode 27 with a finger pitch 38 of 2.2 μm can resonate in composite mode with the following mode resonant frequencies: Mode1 resonant frequency=1.34 GHz; Mode1 resonant frequency=2.03 GHz; and Mode3 resonant frequency=2.82 GHz.

In an example, for resonator body 4 having optional bottom conductive layer 10 in the form of sheet electrode 33 and a top conductive layer 6 in the form of comb electrode 27 with a finger pitch 38 of 1.8 μm, resonator body 4 can resonate in composite mode with the following mode resonant frequencies: Mode1 resonant frequency=1.49 GHz; Mode2 resonant frequency=2.38 GHz; and Mode3 resonant frequency=3.05 GHz. In this example, the percentage of lateral mode resonance, L, of the composite mode resonance can be: Lmode1=53%; Lmode2=78%; and Lmode3=27%, respectively. See also FIG. 10 which is a plot of frequency vs. dB for this example resonator body 4. In FIG. 10, each peak 82, 84 and 86, represents a response of resonator body 4 at the respective Mode1 resonant frequency=1.49 GHz; the Mode2 resonant frequency=2.38 GHz; and the Mode3 resonant frequency=3.05 GHz.

In an example, for resonator body 4 having optional bottom conductive layer 10 in the form of sheet electrode 33 and a top conductive layer 6 in the form of comb electrode 27 with a finger pitch 38 of 1.4 μm, resonator body 4 can have the following mode resonant frequencies: Mode1 resonant frequency=1.79 GHz; Mode2 resonant frequency=2.88 GHz; and Mode3 resonant frequency=3.36 GHz. For this example resonator body 4, the percentage of lateral mode resonance, L, of the composite mode resonance can be: Lmode1=70%; Lmode2=74%; and Lmode3=35%.

In an example, the foregoing description of resonator body 4 resonating in a thickness mode, in a lateral mode, or in a composite mode, can also be applicable to each example UBAR 2 shown in FIGS. 1-3 that can include a resonator body 4 in combination with one or more connecting structures 34 and 36, described in more detail hereinafter.

With ongoing reference to FIGS. 1-3, in one preferred and non-limiting embodiment or example, the bottommost layer of each resonator body 4 shown in FIGS. 1-3 can be mounted directly to carrier 14 utilizing any suitable and/or desirable mounting technique, e.g., eutectic mounting, adhesive, etc. Herein, "mounted directly", "mounting . . . directly", and similar phrases are to be understood as the bottommost layer of each resonator body 4 shown in FIGS. 1-3 being positioned proximate to carrier 14 and joined to carrier 14 in any suitable and/or desirable manner, such as, in an example, mounting, attaching, etc., and/or by any suitable and/or desirable means, such as, in an example, eutectic bonding, conductive adhesive, non-conductive adhesive, etc. In one preferred and non-limiting embodiment or example, carrier 14 can be a surface of a package, such as an conventional integrated circuit (IC) package. After the bottommost layer of a resonator body 4 is mounted to the surface of said package, resonator body 4, and, more generally, UBAR 2, can, in a manner known in the art, be sealed in said package to protect resonator body 4, and, more generally, UBAR 2, against external environmental conditions. In an example, the use of a package, like a conventional ceramic IC package commercially available from, e.g., NTK Ceramic Co., Ltd. of Japan, for mounting UBAR is envisioned. However, this is not to be construed in a limiting sense since it is envisioned that resonator body 4 and/or UBAR 2 can be mounted in any suitable and/or desirable package now known or hereinafter developed.

In another example, carrier 14 can be the surface of an substrate, such as, for example, a sheet of ceramic, a sheet of conventional printed circuit board material, etc. The description herein of example substrates to which the bottommost layer of each resonator body 4 and/or UBAR 2 shown in FIGS. 1-3 can be mounted is for illustration purposes only and is not to be construed in a limiting sense. Rather, carrier 14 can be made of any suitable and/or desirable material that is not incompatible with the material forming the bottommost layer of each resonator body 4 and/or UBAR 2 shown in FIGS. 1-3 and which enables the use of resonator body 4 and/or UBAR 2 in a manner known in the art. Carrier 14 can have any form deemed suitable and/or desirable by one skilled in the art. Accordingly, any description herein of mounting substrate or carrier 14 is not to be construed in a limiting sense.

With ongoing reference to FIGS. 1-3, in one preferred and non-limiting embodiment or example, each UBAR 2 can include one or more optional connecting structures 34 and/or 36 that facilitate the application of electrical signals to top conductive layer 6 and optional bottom conductive layer 10, if provided, of resonator body 4. In one preferred and non-limiting embodiment or example, however, the one or more optional connecting structures 34 and/or 36 may be excluded (i.e., not provided) where electrical signals can be applied directly to top conductive layer 6 and optional bottom conductive layer 10, if provided, of resonator body 4, Accordingly, in an example, UBAR 2 can comprise resonator body 4 without connecting structures 34 and 36. In another example, UBAR 2 can comprise resonator body 4 and a single connecting structure 34 or 36. For the purpose of description only, in one preferred and non-limiting embodiment or example, UBAR 2 comprising resonator body 4 and connecting structures 34 and 36 will be described.

Each connecting structure 34 and 36 can have any suitable and/or desirable form, can be formed in any suitable and/or desirable manner, and can be made of any suitable and/or desirable materials) that can facilitate the provision of separate electrical signals to top conductive layer 6 and optional bottom conductive layer 10, if provided. In an example, where top conductive layer 6 is in the form of comb electrode 27 with only one back 30 or 32, and optional bottom conductive layer 10 is in the form of comb electrode 27 with only one back 30 or 32, or sheet electrode 33, electrical signals can be provided to each of top conductive layer 6 and optional bottom conductive layer 10 via a single connecting structure 34 or 36 that can be configured to provide separate electrical signals to top conductive layer 6 and optional bottom conductive layer 10.

In another example, where at least one of top conductive layer 6 or optional bottom conductive layer 10 has the form of interdigitated electrode 18 or comb electrode 27 having two backs 30 and 32, separate connecting structures 34 and 36 can be provided to separately provide one or more electrical signals to backs 24 and 26 of interdigitated electrode 18 and/or to backs 30 and 32 of comb electrode 27. The forms of top conductive layer 6 and optional bottom conductive layer 10 and manner in which electrical signals are provided to top conductive layer 6 and optional bottom conductive layer 10, if provided, is not be construed in a limiting sense.

In one preferred and non-limiting embodiment or example, while not wishing to be bound by any particular description, example, or theory, examples of first and second connecting structures 34 and 36 that can be used with the example UBARs 2 shown in FIGS. 1-3 will be described next.

In one preferred and non-limiting embodiment or example, for the purpose of description only, each connecting structure 34 and 36 will be described as having extensions of the various layers and/or substrates forming the various examples resonator bodies 4 shown in FIGS. 1-3. However, this is not to be construed in a limiting sense since it is envisioned that each connecting structure 34 and 36 can have any suitable and/or desirable form and/or structure that enable the provision of one or more separate electrical signals to top conductive layer 6 and optional bottom conductive layer 10, if provided.

Figure 5A:
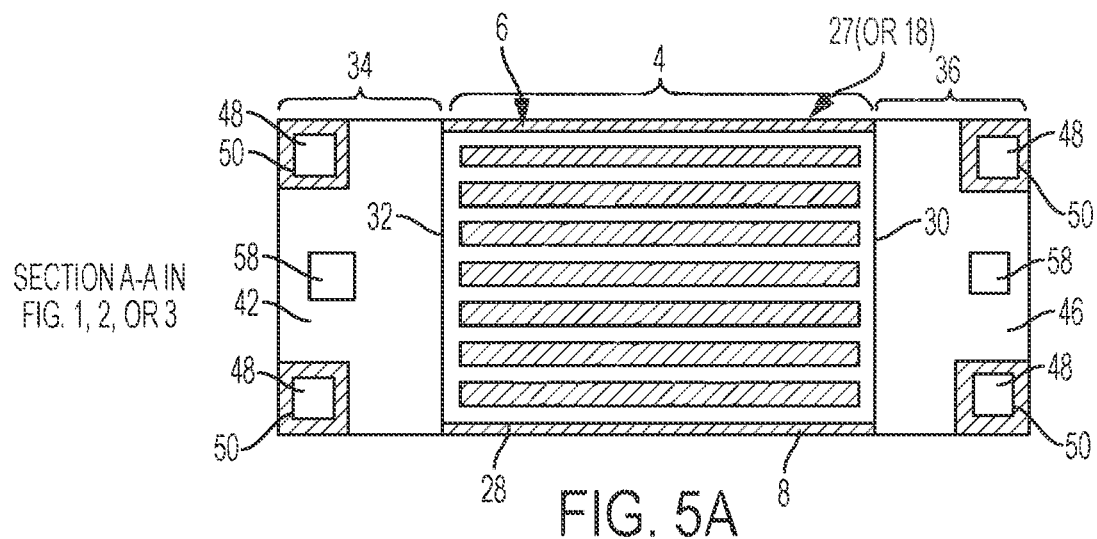
FIGS. 5A-5B are sections of preferred and non-limiting embodiments or examples taken along lines A-A and B-B in each of FIGS. 1-3.
Figure 5B:
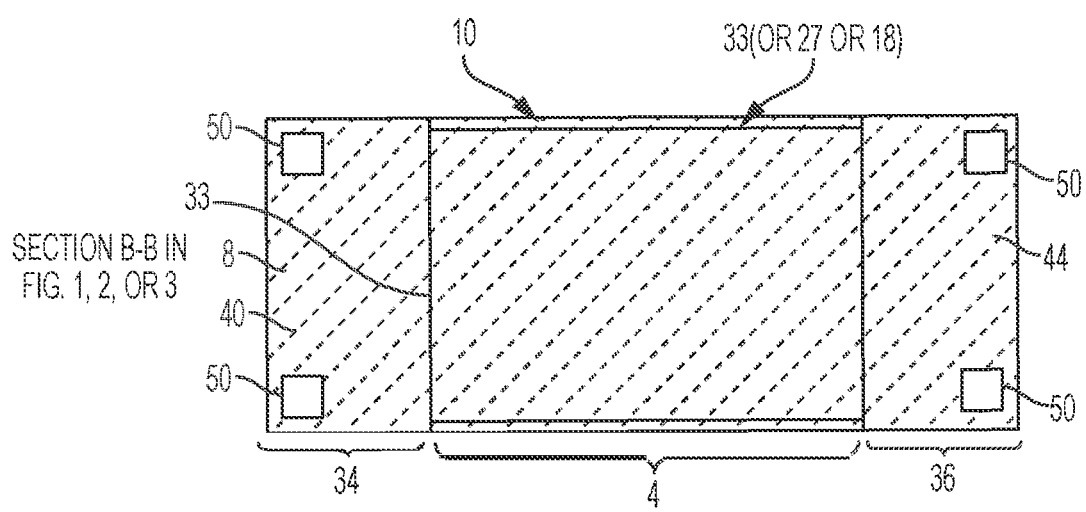

In one preferred and non-limiting embodiment or example, with reference to FIGS. 5A-5B, which can represent views taken along lines A-A and B-B in any one or all of FIGS. 1-3, FIG. 5A shows top conductive layer 6 in the form of comb electrode 27, including back 30 and optional back 32, on top of piezoelectric layer 8. In an example, top conductive layer 6 can alternatively be in the form of interdigitated electrode 18. In one preferred and non-limiting embodiment or example, FIG. 5B shows optional bottom conductive layer 10 in the form of sheet electrode 33 below piezoelectric layer 8 (shown in phantom lines in FIGS. 5B), In an example, optional bottom conductive layer 10 can alternatively be in the form of interdigitated electrode 18 or comb electrode 27. For the purpose of the following examples only, top conductive layer 6 and optional bottom conductive layer 10 will be described as being in the form of comb electrode 18, including back 30 and optional back 32, and sheet electrode 33, respectively. However, this is not to be construed in a limiting sense.

In one preferred and non-limiting embodiment or example, connecting structures 34 and 36 can include bottom metal layers 40 and 44 (FIG. 5B) in contact with sheet electrode 33 forming optional bottom conductive layer 10 of resonator body 4. Each bottom layer 40 and 44 can be in the form of a sheet that is covered by piezoelectric layer 8. In an example, each bottom layer 40 and 44 can be an extension of and can be formed at the same time as sheet electrode 33. In another example, each bottom layer 40 and 44 can be formed separately from sheet electrode 33 and can be made from the same or different material as sheet electrode 33. In an example, connecting structures 34 and 36 can also include top metal layers 42 and 46 on top of piezoelectric layer 8 and in contact with back 30 and back 32, respectively, of comb electrode 27 forming top conductive layer 6 of resonator body 4.

In an example, bottom metal layers 40 and 44 can be connected to contact pads 48 on top surfaces of first and second connecting structures 34 and 36 via conductive vias 50 formed in piezoelectric layer 8 that extend between said contact pads 48 and bottom metal layers 40 and 44. In an example, each top metal layer 42 and 46 can have the shape of a sheet that spaced from the corresponding contact pads 48 by a gap (not numbered). Each top metal layer 42 and 46 can also include a contact pad 58. Each contact pad 48 can be connected, as needed/required, to a suitable signal source (not shown) that can be used to electrical drive/bias optional bottom conductive layer 10 in any suitable and/or desirable manner. Similarly, each contact pad 58 can be connected, as needed/required, to a suitable signal source (not shown) that, can be used to drive/bias top conductive layer 6 in any suitable and/or desirable manner.

As shown by reference numbers 18 and 27 in FIGS. 5A-5B, top conductive layer 6 can alternatively be in the form of interdigitated electrode 18 and optional bottom conductive layer 10 can alternatively be in the form of comb electrode 27 or interdigitated electrode 18.

Figure 6A:
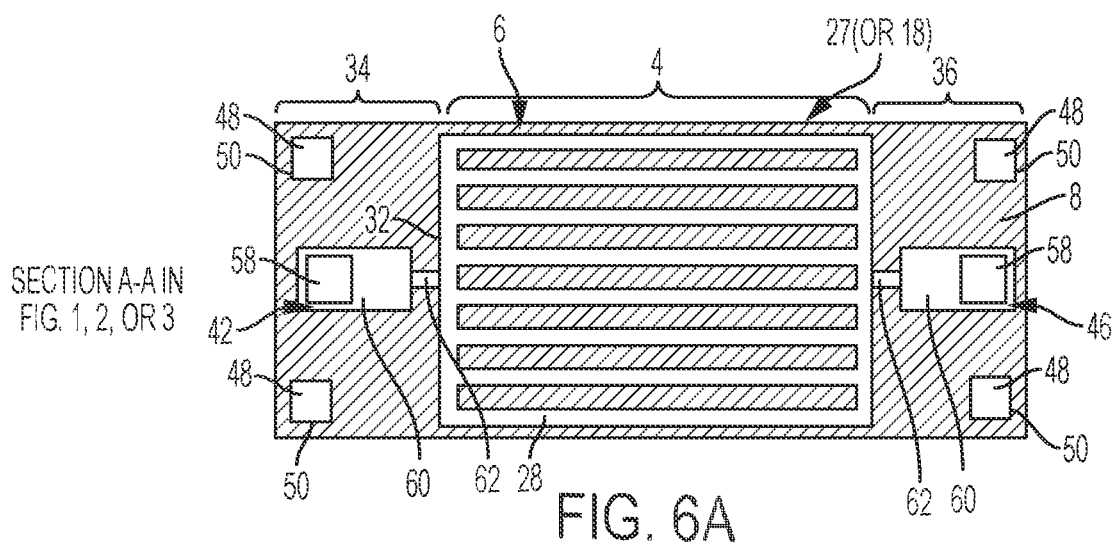
FIGS. 6A-6B are sections of preferred and non-limiting embodiments or examples taken along lines A-A and B-B in each of FIGS. 1-3.
Figure 6B:
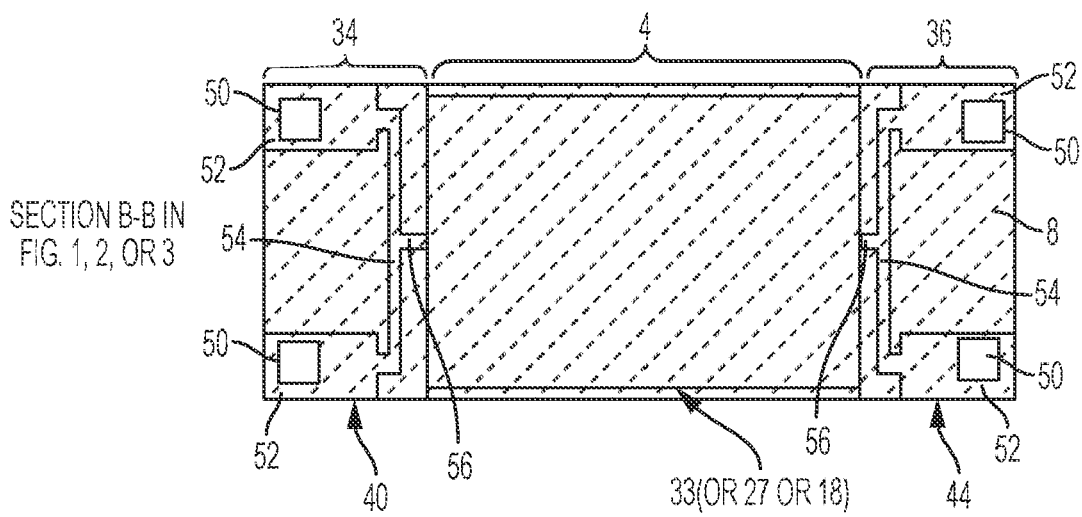

With reference to FIGS. 6A-6B, which can represent views taken along lines A-A and B-B in any one or all of FIGS. 1-3, in one preferred and non-limiting embodiment or example, the examples shown in FIGS. 6A-6B are similar to the examples shown FIGS. 5A-5B with at least the following exception. Bottom metal layers 40 and 44 can each be in the form a pair of spaced conductors 52 (versus the conductive sheets shown in FIGS. 5A-5B) that are connected to optional bottom conductive layer 10 in the form of sheet electrode 33 by a lateral conductor 54 and a tether conductor 56. Top metal layers 42 and 46 can each be in the form a conductor 60. Each conductor 60 can be connected to back 30 or back 32 of comb electrode 27 forming top conductive layer 6 by a tether conductor 62. Tether conductor 62 can be vertically aligned with tether conductor 56 and spaced therefrom by piezoelectric layer 8. In an example, as shown in FIGS. 6A-6B, the width of tether conductor 62 can be less than the width of conductor 60 and the width of tether conductor 56 can be about the same as the width of tether conductor 62.

Figure 7A:
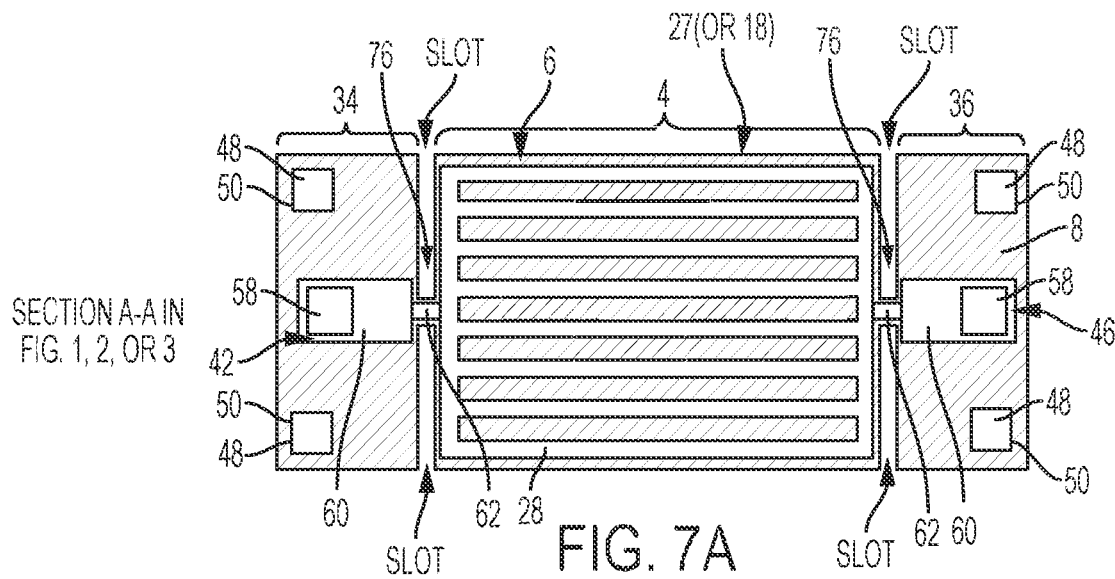
FIGS. 7A-7B are sections of preferred and non-limiting embodiments or examples taken along lines A-A and B-B in each of FIGS. 1-3.
Figure 7B:
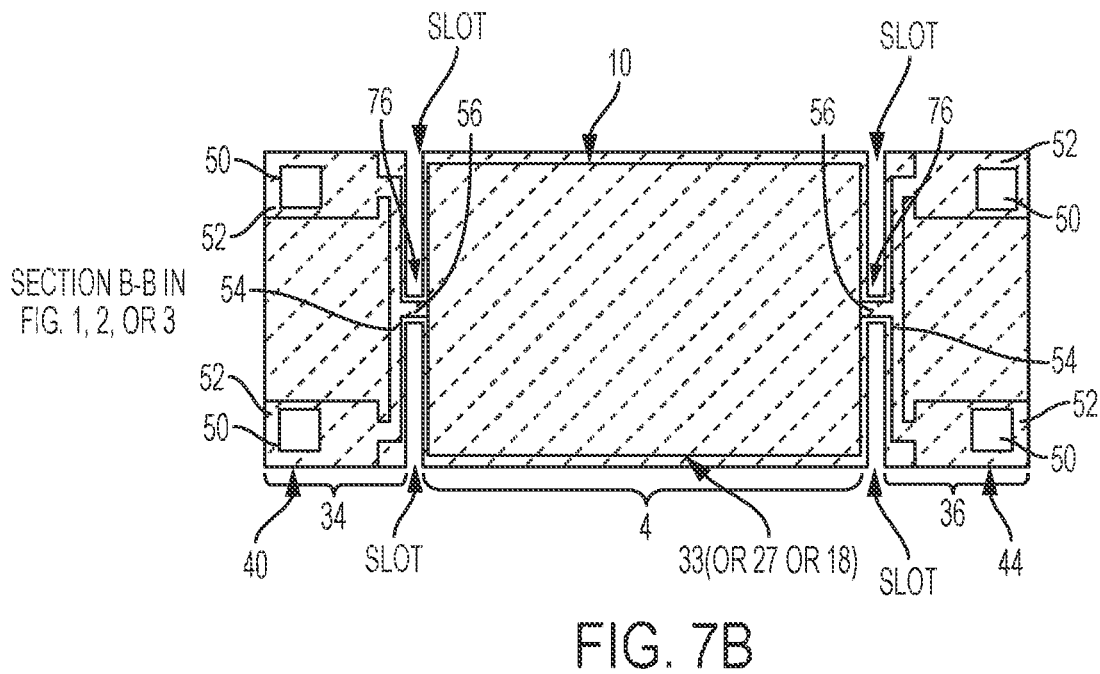

With reference to FIGS. 7A-7B, which can represent views taken along lines A-A and B-B in any one or all of FIGS. 1-3, in one preferred and non-limiting embodiment or example, the examples shown in FIGS. 7A-7B are similar to the examples shown in FIGS. 6A-6B with at least the following exception. Some or all of the materials of each connecting structure 34 and 36 on both sides of the tether conductor(s) 62 and 56, if provided, of said connecting structure can be removed, thereby forming slots that can extend some or all of the distance from the top to the bottom of UBAR 2 on both sides of said tether conductor(s) between the remaining part of said connecting structure and resonator body 4. The removal of some or all of the materials of each connecting structure 34 and 36 on both sides of the tether conductor(s) of said connecting structure can, in an example, define a tether structure 76 that can include tether conductor(s) 62 and 56, if provided, and the portion of the piezoelectric layer 8 in vertical alignment with tether conductor 62.

Figure 7C:
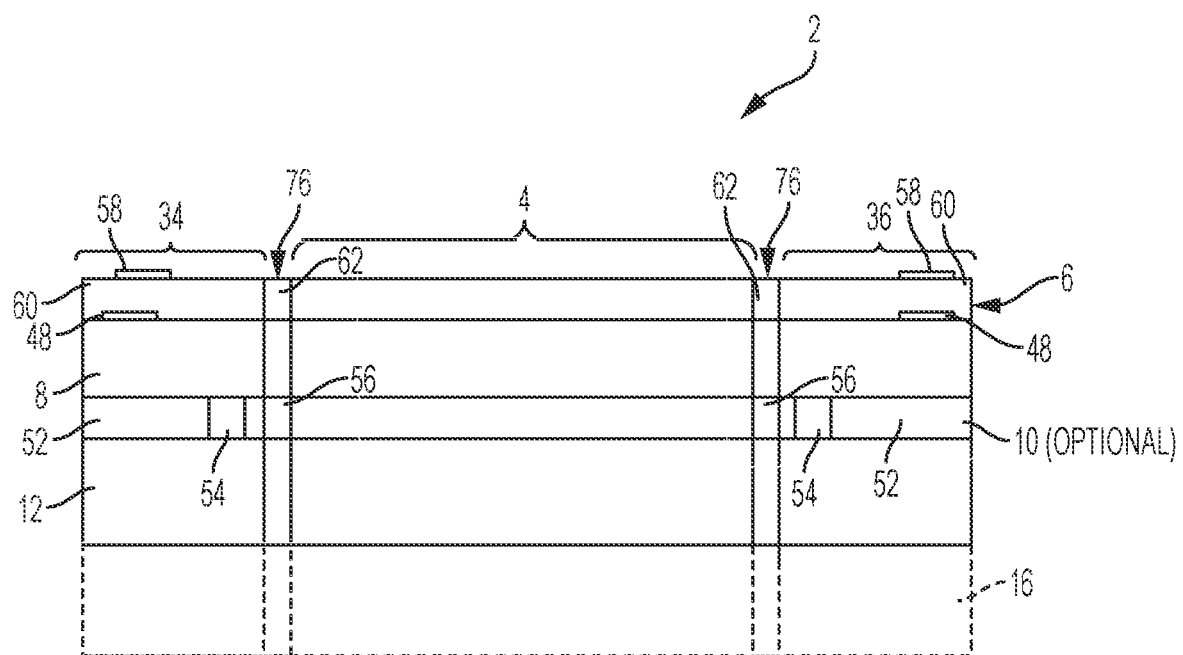
FIG. 7C is a side view of one preferred and non-limiting embodiment or example unsuspended bulk acoustic resonator according to the principles of the present invention with materials of the first and second connecting structures and on both sides of the tether conductors removed as shown in FIGS. 7A-7B.

With reference to FIG. 7C and with continuing reference to FIGS. 7A-7B, in one preferred and non-limiting embodiment or example, the removal of some or all of the materials forming each connecting structure 34 and 36 on both sides of the tether conductor(s) 62 and 56, if provided, of said connecting structure can be used with any example UBAR 2 shown in FIGS. 1-3. For example, FIG. 7C shows a side view of the example UBAR 2 shown in FIG. 1 with the materials of first and second connecting structures 34 and 36 on both sides of the tether conductor 62 and 56, if provided, of each said connecting structure removed, as shown in FIGS. 7A-7B. As can be understood from FIGS. 7A-7C, the materials removed on both sides of the tether conductor(s) 62 and 56, if provided, of each connecting structure can include portions of top conductive layer 6, piezoelectric layer 8, optional bottom conductive layer 10, if provided, and device layer 12, whereupon, in the views shown in FIGS. 7A-7B, no material is visible in the slots formed by the removal of these materials of each connecting structure 34 and 36 on both sides of tether conductor(s) 62 and 56, if provided, of said connecting structure. In the example shown in FIGS. 7A-7C, each tether structure 76 can include, from top to bottom, tether conductor 62, a portion of piezoelectric layer 8 in vertical alignment with tether conductor 62, optional tether conductor 56 (when bottom conductive layer 10 is present), and a portion of device layer 12 in vertical alignment with tether conductor 62.

In another example, where a UBAR 2 includes substrate 16 (FIG. 2), shown in phantom in FIG. 7C, and, optionally, one or more additional device layers 12-1 and/or substrates 16-1 (FIG. 3), the material forming substrate 16 and, if provided, each additional device layer 12-1 and/or substrate 16-1 on both sides of the tether conductor(s) 62 and 56, if provided, of each connecting structure 34 and 36 can also be removed, whereupon, in the views shown in FIGS. 7A-7B, no material would be visible in the slots formed by the removal of these materials of each connecting structure 34 and 36 on both sides of the tether conductor(s) 62 and 56, if provided, of said connecting structure.

In an example, where the views shown in FIGS. 7A-7B are of the example UBAR 2 shown in FIG. 2, each tether structure 76 can include, from top to bottom, tether conductor 62, a portion of piezoelectric layer 8 in vertical alignment with tether conductor 62, optional tether conductor 56 (when optional bottom conductive layer 10 is present), a portion of device layer 12 in vertical alignment with tether conductor 62, and a portion of substrate 16 in vertical alignment with the portion of device layer 12. In another example, where the views shown in FIGS. 7A-7B are of the example UBAR 2 shown in FIG. 3, each tether structure 76 can include, from top to bottom, tether conductor 62, a portion of piezoelectric layer 8 in vertical alignment with tether conductor 62, optional tether conductor 56 (when optional bottom conductive layer 10 is present), portions of device layers 12 and 12-1 in vertical alignment with tether conductor 62, and portions of substrates 16 and 16-1 in vertical alignment with tether conductor 62.

Figure 8A:
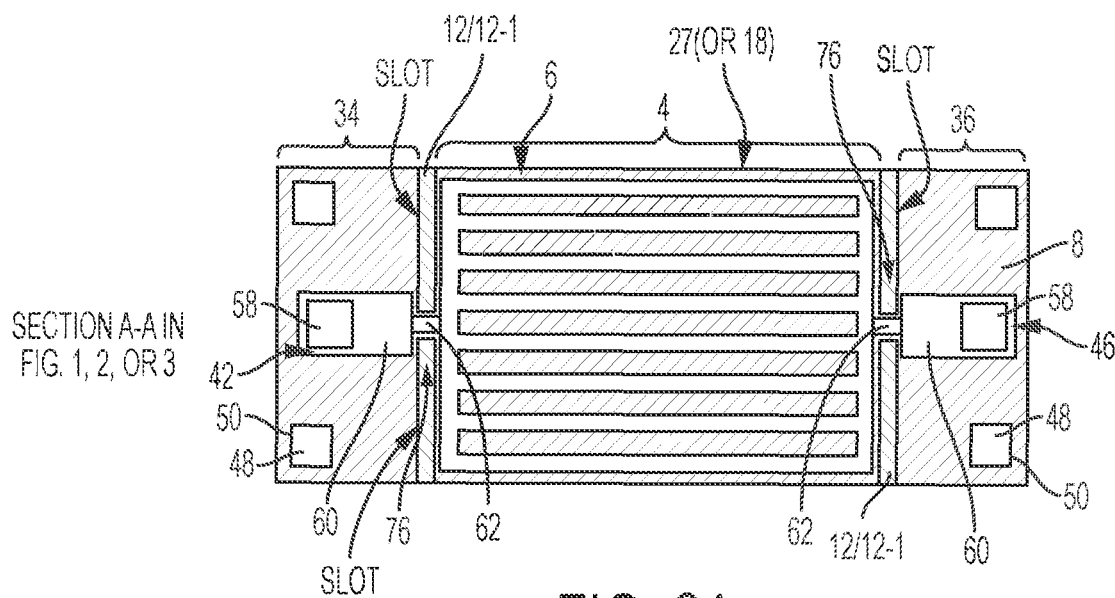
FIGS. 8A-8B are sections of preferred and non-limiting embodiments or examples taken along lines A-A and B-B in each of FIGS. 1-3.
Figure 8B:
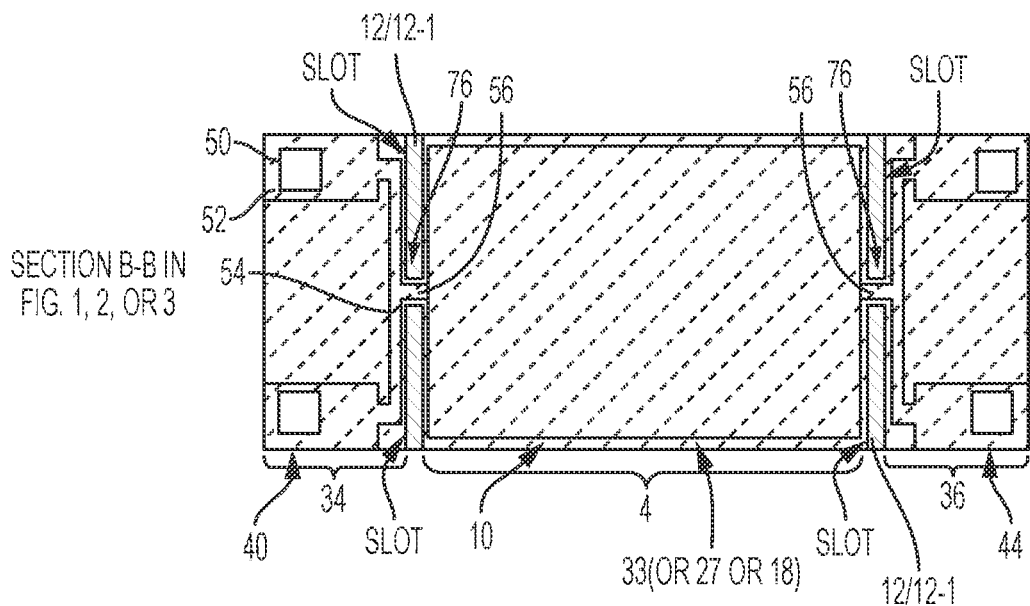
Figure 8C:
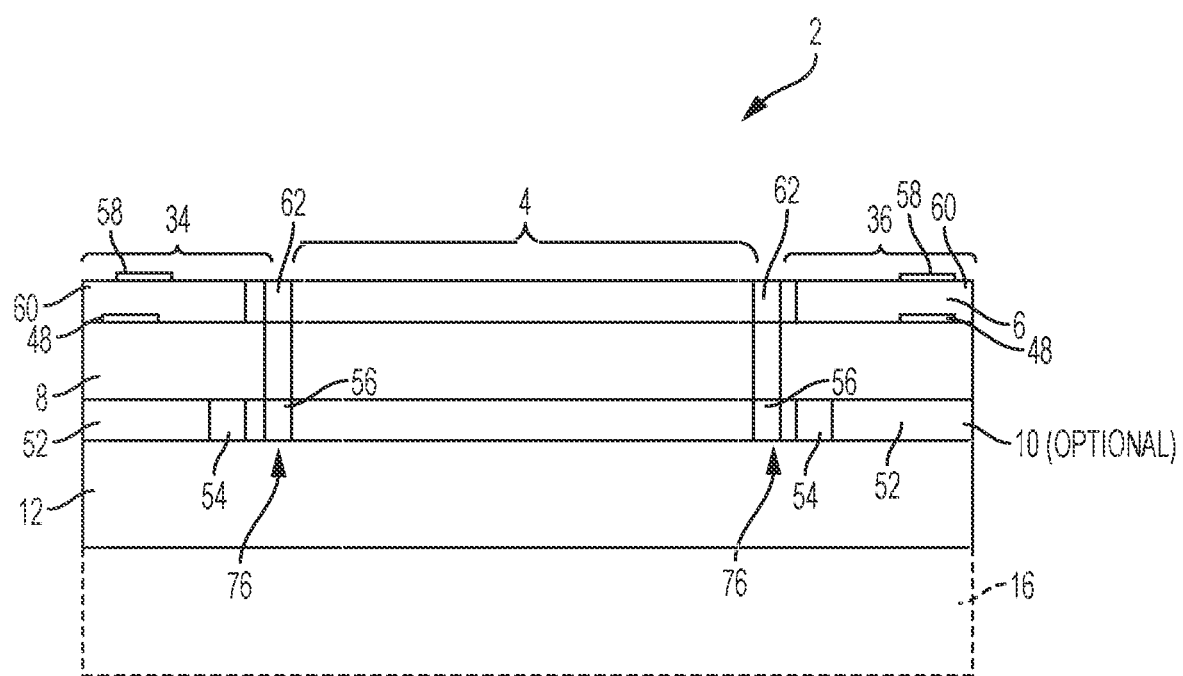
FIG. 8C is a side view of one preferred and non-limiting embodiment or example unsuspended bulk acoustic resonator according to the principles of the present invention with materials of the first and second connecting structures and on both sides of the tether conductors removed as shown in FIGS. 8A-8B.

With reference to FIGS. 8A-8B, which can represent views taken along lines A-A and B-B in any one or all of FIGS. 1-3, in one preferred and non-limiting embodiment or example, the examples shown in FIGS. 8A-8B are similar to examples shown in FIGS. 7A-7B with at least the following exception. Namely, the material forming all or part of at least one device layer 12 or 12-1 of each connecting structure 34 and 36 is retained on both sides of the tether conductor(s) 62 and 56, if provided, of said connecting structure, whereupon said material of said at least one device layer 12 or 12-1 is visible in the slots on both sides of the tether conductor(s) 62 and 56, if provided, of said connecting structure. In an example, where the views shown in FIGS. 8A-8C are of the example UBAR 2 shown in FIG. 1, each tether structure 76 can include, from top to bottom, tether conductor 62, a portion of piezoelectric layer 8 in vertical alignment with tether conductor 62, and optional tether conductor 56 (when optional bottom conductive layer 10 is present). In this example, device layer 12 is retained and would be visible in the slots shown in FIGS. 8A-8B.

In another example, where the views shown in FIGS. 8A-8B are of the example UBAR 2 shown in FIG. 2, each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of device layer 12 in vertical alignment with tether conductor 62. In this example, device layer 12 is retained and would be visible in the slots shown in FIGS. 8A-8B and substrate 16 (shown in phantom in FIG. 8C) below device layer 12 would also be retained, but would not be visible in the slots shown in FIGS. 8A-8B.

In another example, where the views shown in FIGS. 8A-8B are of the example UBAR 2 shown in FIG. 3, each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of device layer 12 in vertical alignment with tether conductor 62. In an example, where device layer 12 is retained and is visible in the slots shown in FIGS. 8A-8B, substrate 16 below device layer 12 is also retained, but would not be visible in the slots shown in FIGS. 8A-8B, and each tether structure 76 would also include a portion of device layer 12-1 and a portion of substrate 16-1 in vertical alignment with tether conductor 62, In another example, where device layer 12-1 is retained and is visible in the slots shown in FIGS. 8A-8B, substrates 16 and 16-1 and device layer 12 would also be retained, but would not be visible in the slots shown in FIGS. 8A-8B.

Figure 8D:
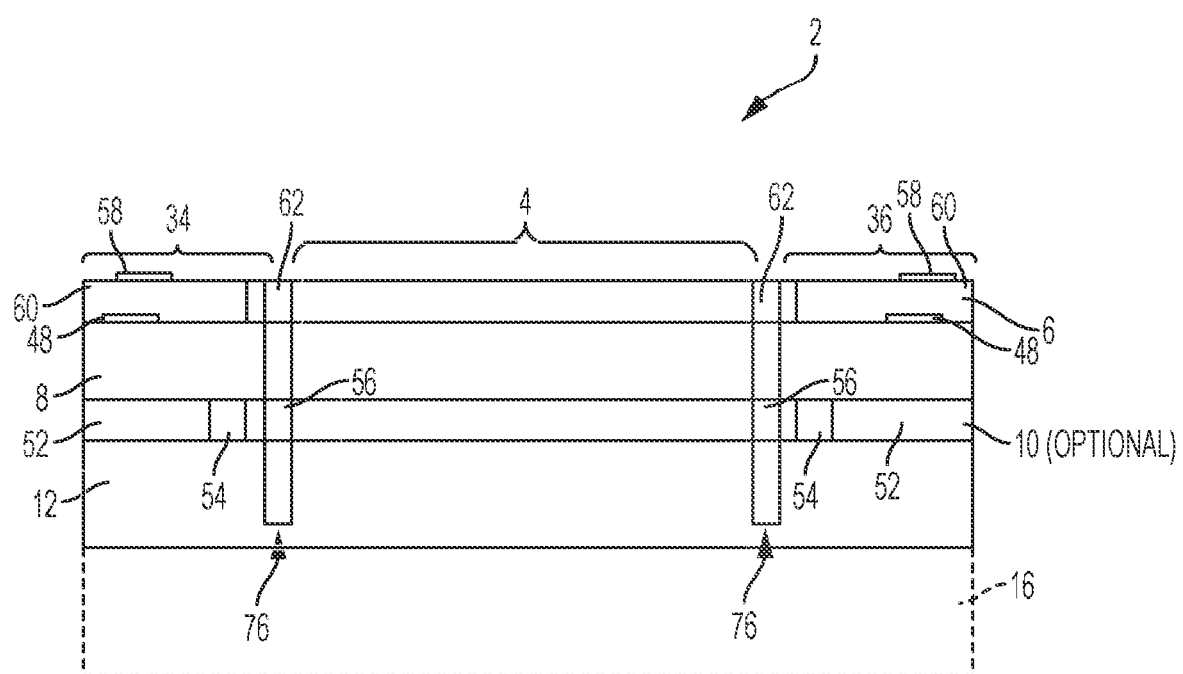
FIG. 8D is a side view of one preferred and non-limiting embodiment or example unsuspended bulk acoustic resonator according to the principles of the present invention with materials of the first and second connecting structures and on both sides of the tether conductors removed as shown in FIGS. 8A-8B.

In another example shown in FIG. 8D, for the example UBAR 2 shown in FIG. 1 or 2, each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of the body of device layer 12 in vertical alignment with tether conductor 62 exposed by the partial removal of device layer 12 on both sides of the tether conductor(s) 62 and 56, if provided, of each connecting structure 34 and 36. Where the example shown in FIG. 8D UBAR 2 shown in FIG. 2, substrate 16 (shown in phantom in FIG. 8D) is retained below device layer 12 and would not be visible in the views shown in FIG. 8A-8B.

In another example, for the example UBAR 2 shown in FIG. 3, each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of the body of device layer 12 or device layer 12-1 in vertical alignment with tether conductor 62 exposed by the partial removal of said device layer 12 or 12-1 (similar to the partial removal of device layer 12 shown in FIG. 8D) on both sides of the tether conductor(s) 62 and 56, if provided, of each connecting structure 34 and 36. In an example, where the portion of the body of device layer 12 of UBAR 2 shown in FIG. 3 is removed (similar to the partial removal of device layer 12 shown in FIG. 8D), whereupon the portion of the interior of the material forming device layer 12 of UBAR 2 shown in FIG. 3 is visible in the slots shown in FIGS. 8A-8B, each tether structure 76 can also include portions of device layer 12-1 and substrate 16-1 in vertical alignment with tether conductor 62. In this example, substrate 16 is retained, i.e., no portion of substrate 16 is removed, and would not be visible in the views shown in FIGS. 8A-8B.

In another example, where the portion of the body of device layer 12-1 of UBAR 2 shown in FIG. 3 is removed (simile to the partial removal of device layer 12 shown in FIG. 8I)), whereupon the portion of the interior of the material forming device layer 12-1 is visible in the slots shown in FIGS. 8A-8B, each tether structure 76 can also include a portion of the body of device layer 12-1 in vertical alignment with tether conductor 62. In this example, substrates 16 and 16-1 and device layer 12 are retained, i.e., no portions of substrates 16 and 16-1 and device layer 12 are removed, and would not be visible in the views shown in FIGS. 8A-8B.

Figure 9C:
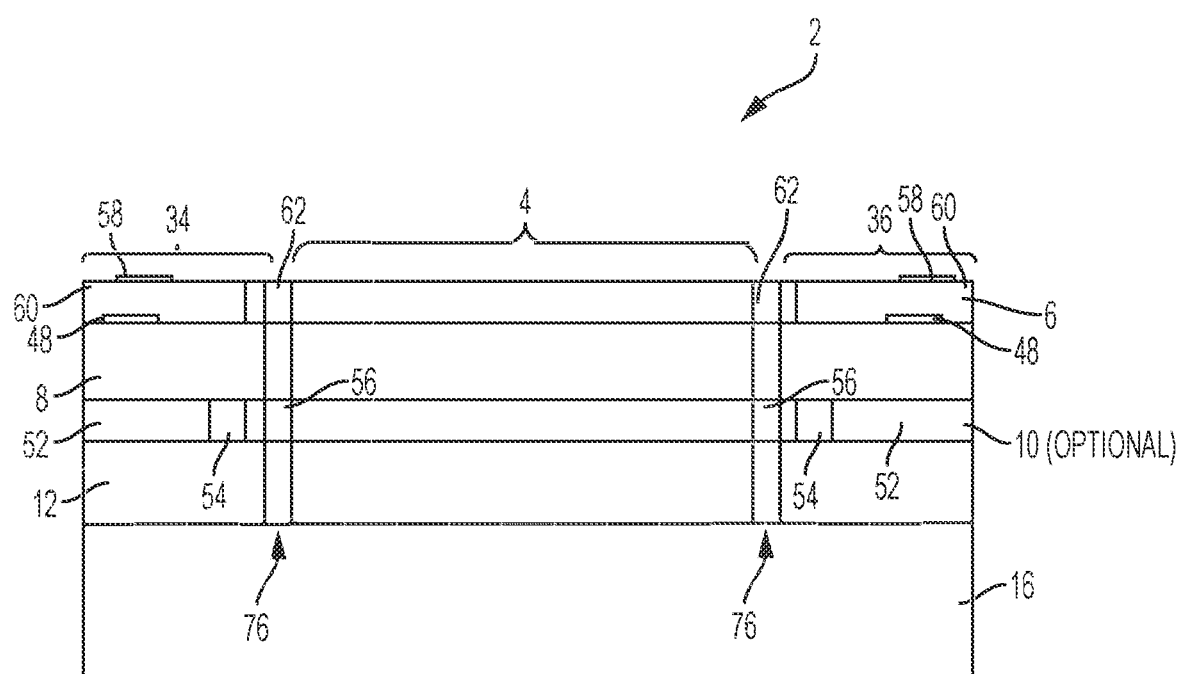
FIG. 9C is a side view of one preferred and non-limiting embodiment or example unsuspended bulk acoustic resonator according to the principles of the present invention with materials of the first and second connecting structures and on both sides of the tether conductors removed as shown in FIGS. 9A-9B.

With reference to FIGS. 9A-9B, which can represent views taken along lines A-A and B-B in any one or all of FIGS. 1-3, for the UBAR 2 shown in FIG. 2, in one preferred and non-limiting embodiment or example, the examples shown in FIGS. 9A-9B are similar to the examples shown in FIGS. 8A-8B with at least the following exception. Each tether structure 76 can include a portion of the material forming device layer 12, whereupon in the views shown in FIGS. 9A-9C, portions of substrate 16 can be visible in the slots formed on both sides of the tether conductor(s) 62 and 56, if provided, of each connecting structure 34 and 36. In this example, substrate 16 is retained and each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of device layer 12 in vertical alignment with tether conductor 62.

With continuing reference to FIGS. 9A-9B, for the UBAR 2 shown in FIG. 3, in one preferred and non-limiting embodiment or example, where device layer 12 and substrates 16 and 16-1 are retained, in the views shown in FIGS. 9A-9B, substrate 16-1 can be visible in the slots formed on both sides of the tether conductors) 62 and 56, if provided, of each connecting structure 34 and 36. In this example, each tether structure 76 can include, from top to bottom, tether conductor 62, a portion of piezoelectric layer 8 in vertical alignment with tether conductor 62, optional tether conductor 56 (when optional bottom conductive layer 10 is present), and a portion of device layer 12-1 in vertical alignment with tether conductor 62.

In another example, for the UBAR 2 shown in FIG. 3, where substrate 16 is retained, whereupon, in the views shown in FIGS. 9A-9B, substrate 16 can be visible in the slots formed on both sides of the tether conductor(s) 62 and 56, if provided, of each connecting structure 34 and 36, each tether structure 76 can include, from top to bottom, tether conductor 62, a portion of piezoelectric layer 8 in vertical alignment with tether conductor 62, optional tether conductor 56 (when optional bottom conductive layer 10 is present), a portion of device layer 12-1 in vertical alignment with tether conductor 62, a portion of substrate 16-1 in vertical alignment with tether conductor 62, and a portion of device layer 12 in vertical alignment with tether conductor 62.

Figure 9D:
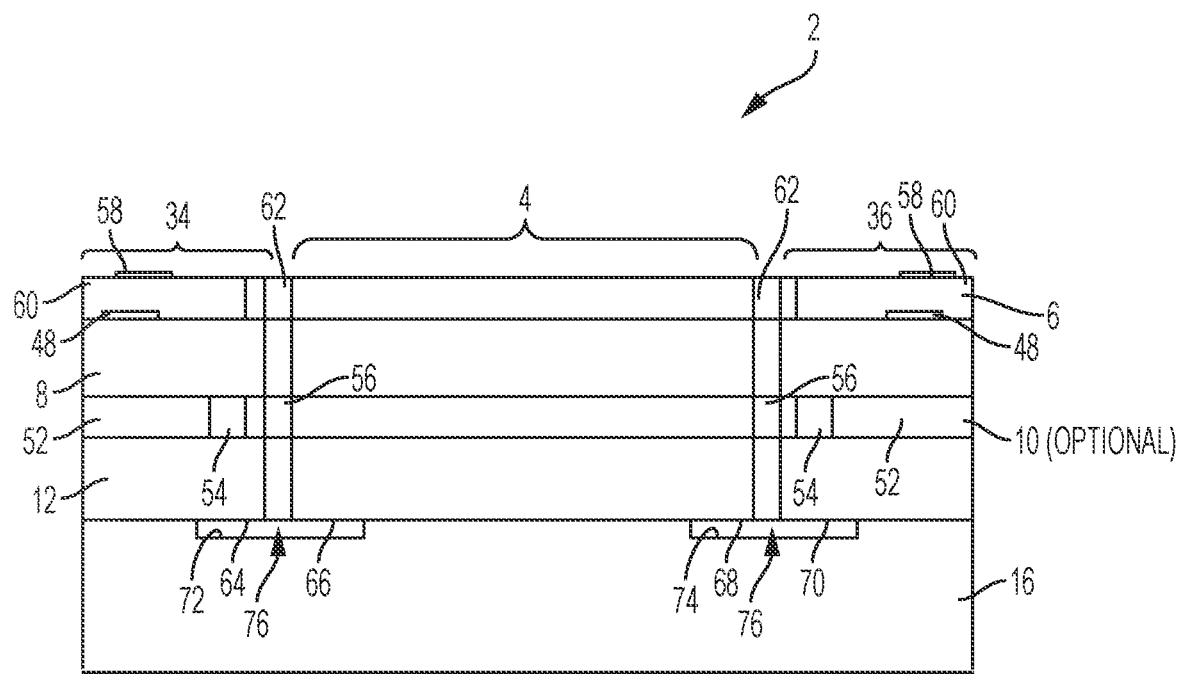

In another example shown in FIG. 9D, for the example UBAR 2 shown in FIG. 2, at the interface of substrate 16 and device layer 12, a portion of the material forming the body of substrate 16 can be removed laterally beneath resonator body 4 and connecting structures 34 and 36, whereupon, as shown in FIG. 9D, bottom portions 64 and 70 of connecting structures 34 and 36 are exposed, bottom portions 66 and 68 of resonator body 4 are exposed, and surfaces 72 and 74 of the body of substrate 16 are exposed. In this example, a portion of the material forming the body of substrate 16 removed can extend into the plane of FIG. 9D to the portion of the material of substrate 16 vertically aligned with each tether structure 76. In this example, each tether structure 76 can include, from top to bottom, tether conductor 62, a portion of piezoelectric layer 8 in vertical alignment with tether conductor 62, optional tether conductor 56 (when optional bottom conductive layer 10 is present), a portion of device layer 12 in vertical alignment with tether conductor 62, and a portion of substrate 16 in vertical alignment with tether conductor 62 proximate the portion of device layer 12. In this example, surfaces 72 and 74 can be visible in the slots shown in FIGS. 9A-9B.

In another, alternative example, for the example UBAR 2 shown in FIG. 3, a portion of the material forming substrate 16-1 or 16 can be removed laterally beneath resonator body 4 and connecting structures 34 and 36, similar to the removal of the material forming substrate 16 in FIG. 9D, whereupon surfaces (like surfaces 72 and 74) of the material forming substrate 16-1 or 16 are exposed and can be visible in the slots shown in FIGS. 9A-9B.

In an example, where the surfaces (like surfaces 72 and 74) of the material forming substrate 16-1 of the example UBAR 2 of FIG. 3 are exposed and can be visible in the slots shown in FIGS. 9A-9B, each tether structure 76 can also include a portion of device layer 12-1 in vertical alignment with tether conductor 62 and a portion of material forming substrate 16-1 in vertical alignment with tether conductor 62 proximate device layer 12-1. In this example, only a portion of the body of substrate 16-1 is removed to form each slot, and device layer 12 and substrate 16 are retained, i.e., no portions of device layer 12 and substrate 16 are removed, and are not visible in the views shown in FIGS. 9A-9B.

In another example, where the surfaces (like surfaces 72 and 74) of the material forming substrate 16 of the example UBAR 2 of FIG. 3 are exposed and can be visible in the slots shown in FIGS. 9A-9B, each tether structure 76 can also a portion of device layer 12-1 in vertical alignment with tether conductor 62, a portion substrate 16-1 in vertical alignment with tether conductor 62, a portion device layer 12 in vertical alignment with tether conductor 62, and a portion of the material forming substrate 16 in vertical alignment with tether conductor 62 proximate device layer 12. In this example, only a portion of the body of substrate 16 is removed to form each slot.

In one preferred and non-limiting embodiment or example, in any of the examples discussed above where bottom conductive layer 10 is not present, bottom metal layers 40 and 44 of connecting structures 34 and 36 need not be present.

In one preferred and non-limiting embodiment or example, each tether structure 76 described above can include at least tether conductor 62, optional tether conductor 56 (when optional bottom conductive layer 10 is present), and only the portion of piezoelectric layer 8 in vertical alignment with tether conductor 62. In another preferred and non-limiting embodiment or example, each tether structure 76 can also include only the portions of one or more of the following in vertical alignment with tether conductor 62: device layer 12, substrate 16, device layer 16-1, and/or substrate 16-1. However, this is not to be construed in a limiting sense.

In one preferred and non-limiting embodiment or example, for each example resonator body 4 shown in FIGS. 1-3, the widths of at least top conductive layer 6, optional bottom conductive layer 10, if provided, and the portion of piezoelectric layer 8 below top conductive layer 6 can all be the same. Also or alternatively, in an example, the widths and/or dimensions of device layer 12, substrate 16, and, if provided, device layer 12-1 and/or substrate 16-1, can all be the same as the widths and/or dimensions of top conductive layer 6, optional bottom conductive layer 10, if provided, and piezoelectric layer 8.

In one preferred and non-limiting embodiment or example, any one or more of the surfaces of any example resonator body 4 shown in FIGS. 1-3 and/or one or all of the surfaces of anyone or more connecting structures 34 and/or 36, if provided, can be etched as deemed suitable and/or desirable to optimize the quality factor and/or insertion loss of any example UBAR 2 shown in FIGS. 1-3, For example, top and bottom surfaces of any example resonator body 4 shown in FIGS. 1-3 can be etched. Also or alternatively, one or more side surfaces of any example resonator body 4 shown in FIGS. 1-3 can be etched, whereupon each of said side surfaces can be vertically planar.

In one preferred and non-limiting embodiment or example, where top conductive layer 6, optional bottom conductive layer 10, if provided, or both are in the form interdigitated electrode 18, one back 22 or 26 of said interdigitated electrode 18 can be connect to and driven by a suitable signal source while the other back 22 or 26 can be unconnected to a signal source. In another preferred and non-limiting embodiment or example, where top conductive layer 6, optional bottom conductive layer 10, if provided, or both are in the form interdigitated electrode 18, back 22 of said interdigitated electrode 18 can be connect to and driven by one signal source and back 26 of said interdigitated electrode 18 can be connect to and driven by a second signal source. In an example, the second signal source can be the same or different than the first signal source.

In one preferred and non-limiting embodiment or example, each instance of device layer 12 (or 12-1) can have an acoustic impedance $\geq 60 \times 10^6$ Pa-s/m$^3$. In another example, each instance of device layer 12 (or 12-1) can have an acoustic impedance $\geq 90 \times 10^6$ Pa-s/m$^3$. In another example, each instance of device layer 12 (or 12-1) can have an acoustic impedance $\geq 500 \times 10^6$ Pa-s/m$^3$. In one preferred and non-limiting embodiment or example, each substrate layer 16 can have an acoustic impedance $\geq 100 \times 10^6$ Pa-s/m$^3$. In another example, each substrate layer 16 can have an acoustic impedance $\geq 60 \times 10^6$ Pa-s/m$^3$.

In one preferred and non-limiting embodiment or example, the reflectance (R) of an acoustic wave at the interface of device layer 12 and piezoelectric layer 8 or, if provided, optional bottom conductive layer 10, can be greater than 50%. In another example, the reflectance (R) of an acoustic wave at the interface of device layer 12 device layer 12 and piezoelectric layer 8 or, if provided, optional bottom conductive layer 10, can be greater than 70%. In another example, the reflectance (R) of an acoustic wave at the interface of device layer 12 and piezoelectric layer 8 or, if provided, optional bottom conductive layer 10, can be greater than 90%.

In one preferred and non-limiting embodiment or example, the reflectance (R) of an acoustic wave at the interface of a device layer 12 of 12-1 and piezoelectric layer 8 or, if provided, optional bottom conductive layer 10, can be greater than 70%. In an example, the reflectance R at the interface of any two layers 6 and 8; 8 and 10; 8 or 10 and 12 or 12-1; or 12 or 12-1 and 16 or 16-1, or at the interface of a device layer 12 or 12-1 and a substrate 16 or 16-1 can be determined according to the following equation:

$$R = |(Zb-Za)/(Za+Zb)|$$

wherein Za=the acoustic impedance of a first layer, e.g., piezoelectric layer 8 or, if provided, optional bottom conductive layer 10, that sits atop of a second layer; and Zb=the acoustic impedance of the second layer, e.g., device layer 12.

Other examples of first and second layers can include instances of device layer 12 or 12-1 atop of substrate 16 or 16-1.

In one preferred and non-limiting embodiment or example, the overall reflectance (R) of any example resonator body 4 shown in FIGS. 1-3 can be >90%.

In one preferred and non-limiting embodiment or example, device layer 12 can be a layer of diamond formed in a manner known in the art. In an example, substrate 16 can be formed from silicon.

In one preferred and non-limiting embodiment or example, device layer 12 formed of diamond can be grown by chemical vapor deposition (CVD) of diamond on a substrate 16 or 16-1 or a sacrificial substrate (not shown). In one preferred and non-limiting embodiment or example, optional bottom conductive layer 10, piezoelectric layer 8, and top conductive layer 6 can be deposited on device layer 12 and, as required, patterned (e.g., comb electrode 27 or interdigitated electrode 18) utilizing conventional semiconductor processing techniques which will not be described further herein.

Herein, each temperature compensation layer 90, 92, and 94 can comprise at least one of silicon and oxygen. For example, each temperature compensation layer can comprise silicon dioxide, or a silicon element, and/or an oxygen element.

In one preferred and non-limiting embodiment or example, each UBAR 2 shown in FIGS. 1-3 can have an unloaded quality factor $\geq 100$. In another example, each UBAR 2 shown in FIGS. 1-3 can have an unloaded quality factor $\geq 50$. In one preferred and non-limiting embodiment or example, the thickness of piezoelectric layer 8, each device layer 12, and, if provided, each substrate 16 of each example resonator body 4 shown in FIGS. 1-3, can be selected in any suitable and/or desirable manner to optimize the performance of resonator body 4. Similarly, in an example, the dimensions of each example resonator body 4 shown in FIGS. 1-3, can be selected for target performance such as, without limitation, insertion lost, power handling capability, and thermal dissipation. In one preferred and non-limiting embodiment or example, when diamond is used as the material for a device layer 12, the surface of said diamond layer at the interface with bottom layer 12 can be optically finished and/or physically dense. In an example, the diamond material forming device layer 12 can be undoped or doped, e.g., P-type or N-type. The diamond material can be polycrystalline, nanocrystalline, or ultrananocrystalline. In an example, when silicon is used as the material for each instance of substrate 16, said silicon can be undoped or doped, e.g., P-type or N-type, and monocrystalline or polycrystalline. The diamond material forming the device layer can have a Raman half-height-peak-width of ≤20 cm$^{-1}$.

In one preferred and non-limiting embodiment or example, piezoelectric layer 8 can be formed of ZnO, AlN, InN, alkali metal or alkali earth metal niobate, alkali metal or alkali earth metal titanate, alkali metal or alkali earth metal tantalite, GaN, AlGaN, lead zirconate titanate (PZT), polymer or a doped form of any of the foregoing materials.

In one preferred and non-limiting embodiment or example, device layer 12 can be formed of any suitable and/or desirable high acoustic impedance material. In an example, a material having an acoustic impedance between $10^6$ Pa-s/m$^3$ and $63 \times 10^6$ Pa-s/m$^3$ or greater can be considered a high acoustic impedance material. Examples of typical high acoustic impedance materials can include: diamond (~$630 \times 10^6$ Pa-s/m$^3$); W (~$99.7 \times 10^6$ Pa-s/m$^3$); Al; Pt; Pd; Mo; Cr; Ti; Ta; element from Group 3A or 4A of the periodic table; a transition element from Group 1B, 2B, 3B, 4B, 5B, 6B, 7B, or 8B of the periodic table; ceramic; glass, and polymer. This list of high acoustic impedance materials is not to be construed in a limiting sense.

In one preferred and non-limiting embodiment or example, substrate 16 can be formed of any suitable and/or desirable low acoustic impedance material. In an example, a material having an acoustic impedance between $10^6$ Pa-s/m$^3$ and $30 \times 10^6$ Pa-s/m$^3$ can be considered a low acoustic impedance material. Examples of typical low acoustic impedance materials can include: ceramic; glass, crystals, and minerals having an acoustic impedance between $10^6$ P-s/m$^3$ and $30 \times 10^6$ Pa-s/m$^3$; ivory ($1.4 \times 10^6$ Pa-s/m$^3$); alumina/sapphire ($25.5 \times 10^6$ Pa-s/m$^3$); alkali metal K ($1.4 \times 10^6$ Pa-s/m$^3$); and silicon ($19.7 \times 10^6$ Pa-s/m$^3$). This list of low acoustic impedance materials is not to be construed in a limiting sense.

In one preferred and non-limiting embodiment or example, depending on choice of materials forming each example resonator body 4, one or more materials typically considered to be high acoustic impedance materials can function as a low acoustic impedance material of resonator body 4. For example, where diamond is used as the material for device layer 12, W can be used as the material for substrate 16. Hence, achieving a desired reflectance R (discussed above) at an interface of two layers or substrates of resonator body 4 can determine which material can be used as a high acoustic impedance material and which material can be used as a low acoustic impedance material.

In one preferred and non-limiting embodiment or example, a bulk acoustic resonator, in accordance with the principles of the present invention, can include a resonator body 4. The resonator body 4 can include a piezoelectric layer 8; a device layer 12; and a top conductive layer 6 on the piezoelectric layer 8 opposite the device layer 12. Substantially all of a surface of the device layer 12 opposite the piezoelectric; layer is for mounting the resonator body 4 to a carrier 14 that is separate from the resonator body 4. In the example, it is desirable but not essential that all of the surface of the device layer opposite the piezoelectric layer can be for mounting the entirety of the resonator body to the carrier. In the example, it is desirable but not essential that the bulk acoustic resonator can include a connecting structure 34 or 36 for conducting a signal to the top conductive: layer. In an example, the device layer can comprise diamond. In an example, the top conductive layer 6 can include a plurality of spaced conductive lines or fingers. In an example, the resonator body 4 can further comprise an optional bottom conductive layer 10 between the piezoelectric layer 8 and the device layer 12.

In one preferred and non-limiting embodiment or example, the resonator body 4 can further include a substrate 16 attached to the device layer 12 opposite the piezoelectric layer 8. In an example, the surface of the device layer 12 can be mounted in its entirety to the substrate 16. In an example, the surface of the substrate 16 facing the carrier 14 can be for mounting in its entirety directly to the carrier 14.

In one preferred and non-limiting embodiment or example, the surface of the device layer 12 facing the carrier 14 can be mounted in its entirety directly to the substrate 16. In an example, the surface of the device layer 12 facing the carrier 14 is for mounting in its entirety directly to the carrier 14.

In one preferred and non-limiting embodiment or example, the resonator body 4 can further include a second device layer 12-1 between the substrate 16 and the piezoelectric layer 8; or a second substrate 16-1 between the substrate 16 and the piezoelectric layer 8; or both.

In one preferred and non-limiting embodiment or example, as used herein, "mounting in its entirety" can mean mounting one layer or substrate directly or indirectly to another layer or substrate. In an example, as used herein, "mounting in its entirety" can, also or alternatively, mean without an intentionally introduced space or gap between one layer or substrate and another layer or substrate. In another example, as used herein, "mounting in its entirety" can, also or alternatively, include naturally occurring spaces that can naturally (but not intentionally) form between one:layer or substrate and another layer or substrate.

Although the invention has been described in detail for the purpose of illustration based on what is currently considered to be the most practical preferred and non-limiting embodiments, examples, or aspects, it is to be understood that such detail is solely for that purpose and that the invention is not limited to the disclosed preferred and non-limiting embodiments, examples, or aspects, but, on the contrary, is intended to cover modifications and equivalent arrangements that are within the spirit and scope of the appended claims. For example, it is to be understood that the present invention contemplates that, to the extent possible, one or more features of any preferred and non-limiting embodiment, example, aspect, or the appended claim can be combined with one or more features of any other preferred and non-limiting embodiment, example, aspect, or the appended claim.

The invention claimed is:
1. A bulk acoustic resonator, comprising:
a resonator body including:
a piezoelectric layer having a thickness; and
a first conductive layer positioned adjacent the piezoelectric layer, the first conducting layer having a plurality of first conductive elements spaced from each other by a first pitch;
wherein the resonator body is configured to resonate in a composite mode of acoustic resonance, the composite mode of the acoustic resonance being a combination of (i) a thickness mode of the acoustic resonance defined by the thickness and (ii) a lateral mode of the acoustic resonance defined by the first pitch.

2. The bulk acoustic resonator of claim 1, further comprising a device layer positioned adjacent the piezoelectric layer, a first surface of the device layer adjacent the piezoelectric layer being configured to support the resonator body adjacent a carrier.

3. The bulk acoustic resonator of claim 2, wherein the device layer is positioned opposite the first conductive layer.

4. The bulk acoustic resonator of claim 2, wherein the device layer comprises diamond.

5. The bulk acoustic resonator claim 2, wherein the resonator body further comprises a second conductive layer positioned between the piezoelectric layer and the device layer.

6. The bulk acoustic resonator of claim 5, wherein the second conductive layer comprises a plurality of second conductive elements spaced from each other by a second pitch.

7. The bulk acoustic resonator of claim 6, wherein the first pitch is equal to the second pitch.

8. The bulk acoustic resonator of claim 5, wherein the second conductive layer comprises a conductive sheet.

9. The bulk acoustic resonator of claim 2, wherein the resonator body further comprises at least one temperature compensation layer positioned: on the first conductive layer opposite the piezoelectric layer; or between the piezoelectric layer and the device layer.

10. The bulk acoustic resonator of claim 2, wherein all of the first surface of the device layer facing the carrier is configured to mount in entirety directly to the carrier.

11. The bulk acoustic resonator of claim 2, wherein:
the resonator body further comprises a substrate positioned adjacent the device layer opposite the piezoelectric layer;
the first surface of the device layer is mounted on the substrate; and
a second surface of the substrate facing the carrier is mounted on the carrier.

12. The bulk acoustic resonator of claim 11, wherein the first surface of the device layer is mounted in its entirety directly to the substrate.

13. The bulk acoustic resonator of claim 11, wherein the substrate comprises silicon.

14. The bulk acoustic resonator of claim 11, wherein the resonator body further comprises at least one temperature compensation layer positioned: on the first conductive layer opposite the piezoelectric layer; between the piezoelectric layer and the device layer; or between the device layer and the substrate.

15. The bulk acoustic resonator of claim 11, wherein the resonator body further comprises:
another device layer positioned between the substrate and the piezoelectric layer; or
another substrate positioned between the substrate and the piezoelectric layer; or both.

16. The bulk acoustic resonator of claim 11, wherein: the device layer has an acoustic impedance $\geq 60 \times 10^6$ Pa-s/m3; and the substrate has an acoustic impedance $\leq 60 \times 10^6$ Pa-s/m3.

17. The bulk acoustic resonator of claim 1, wherein the lateral mode resonance (L) makes up 20% or more of a power (dB) of the composite mode resonance (C).

18. The bulk acoustic resonator of claim 2, comprising a connecting structure positioned next to the resonator body and being formed from the piezoelectric layer, the device layer, and the first conductive layer of the resonator body, the connecting structure being separated by a slot from the resonator body, the connecting structure having a tether structure connected in the slot between the connecting structure and the resonator body, the connecting structure having a conductive via configured to conduct electrical signals to the first conductive layer of the resonator body across the tether structure.

19. A bulk acoustic resonator device, the bulk acoustic resonator device comprising:
a carrier having a carrier surface;
a resonator body having a body surface mounted directly to the carrier surface and including:
a piezoelectric layer having a thickness and having a first acoustic impedance;
a first conductive layer positioned adjacent the piezoelectric layer, the first conducing layer having a plurality of first conductive elements spaced from each other by a pitch; and
wherein the resonator body is configured to resonate in a composite mode of acoustic resonance, the composite mode of the acoustic resonance being a combination of (i) a thickness mode of the acoustic resonance defined by the thickness and (ii) a lateral mode of the acoustic resonance defined by the pitch.

20. The bulk acoustic resonator device of claim 19, further comprising a device layer positioned adjacent the piezoelectric layer opposite the first conductive layer, the device layer being configured to support the resonator body mounted directly to the carrier surface.

21. The bulk acoustic resonator device of claim 20, wherein the device layer has a second acoustic impedance, the second acoustic impedance being greater than the first acoustic impedance.

22. The bulk acoustic resonator device of claim 19, wherein the carrier comprises a ceramic integrated circuit package, a sheet of ceramic, or a sheet of printed circuit board material.

23. The bulk acoustic resonator device of claim 19, comprising an eutectic bond, a conductive adhesive, or a non-conductive adhesive attaching the resonator body to the carrier.

24. The bulk acoustic resonator device of claim 20, wherein all of a surface of the device layer opposite the piezoelectric layer is configured to mount in entirety directly on the carrier.

25. The bulk acoustic resonator of device claim 20, comprising a connecting structure disposed next to the resonator body and being formed from the piezoelectric layer, the device layer, and the first conductive layer of the resonator body, wherein the connecting structure is separated by a slot from the resonator body, the connecting structure having a tether structure connected in the slot between the connecting structure and the resonator body, the connecting structure having a conductive via configured to conduct electrical signals to the first conductive layer of the resonator body across the tether structure.

* * * * *